(12) United States Patent
Sakata et al.

(10) Patent No.: US 10,804,409 B2
(45) Date of Patent: Oct. 13, 2020

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventors: Junichiro Sakata, Atsugi (JP); Tetsunori Maruyama, Atsugi (JP); Yuki Imoto, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 29 days.

(21) Appl. No.: 16/158,478

(22) Filed: Oct. 12, 2018

(65) Prior Publication Data

US 2019/0051754 A1 Feb. 14, 2019

Related U.S. Application Data

(63) Continuation of application No. 14/886,723, filed on Oct. 19, 2015, now Pat. No. 10,103,272, which is a (Continued)

(30) Foreign Application Priority Data

Dec. 11, 2009 (JP) .................... 2009-281505

(51) Int. Cl.
*H01L 29/12* (2006.01)
*H01L 29/786* (2006.01)
(Continued)

(52) U.S. Cl.
CPC ........ *H01L 29/7869* (2013.01); *H01L 27/124* (2013.01); *H01L 29/24* (2013.01)

(58) Field of Classification Search
CPC ........... H01L 29/7869; H01L 1127/124; H01L 29/24; H01L 27/124
See application file for complete search history.

(56) References Cited

U.S. PATENT DOCUMENTS 5,672,889 A * 9/1997 Brown ................ H01L 29/7828
257/77
5,731,856 A 3/1998 Kim et al.
(Continued)

FOREIGN PATENT DOCUMENTS

CN 101258607 A 9/2008
EP 1172858 A 1/2002
(Continued)

OTHER PUBLICATIONS

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.
(Continued)

*Primary Examiner* — Victor A Mandala
*Assistant Examiner* — Colleen E Snow
(74) *Attorney, Agent, or Firm* — Robinson Intellectual Property Law Office; Eric J. Robinson

(57) ABSTRACT

Many of the physical properties of a silicon semiconductor have already been understood, whereas many of the physical properties of an oxide semiconductor have been still unclear. In particular, an adverse effect of an impurity on an oxide semiconductor has been still unclear. In view of the above, a structure is disclosed in which an impurity that influences electrical characteristics of a semiconductor device including an oxide semiconductor layer is prevented or is eliminated. A semiconductor device which includes a gate electrode, an oxide semiconductor layer, and a gate insulating layer provided between the gate electrode and the oxide semiconductor layer and in which the nitrogen concentration in the oxide semiconductor layer is $1 \times 10^{20}$ atoms/cm$^3$ or less is provided.

13 Claims, 16 Drawing Sheets

Related U.S. Application Data continuation of application No. 12/965,197, filed on Dec. 10, 2010, now Pat. No. 9,196,738.

(51) Int. Cl.
 *H01L 27/12* (2006.01)
 *H01L 29/24* (2006.01)

(56) References Cited

U.S. PATENT DOCUMENTS

| | | |
|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,878,962 B1 | 4/2005 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,179,733 B2 | 2/2007 | Sato et al. |
| 7,211,825 B2 | 5/2007 | Shih et al. |
| 7,262,463 B2 | 8/2007 | Hoffman |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,368,067 B2 | 5/2008 | Yata et al. |
| 7,378,286 B2 | 5/2008 | Hsu et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,564,055 B2 | 7/2009 | Hoffman |
| 7,674,650 B2 | 3/2010 | Akimoto et al. |
| 7,732,819 B2 | 6/2010 | Akimoto et al. |
| 7,791,074 B2 | 9/2010 | Iwasaki |
| 7,935,582 B2 | 5/2011 | Iwasaki |
| 7,956,361 B2 | 6/2011 | Iwasaki |
| 7,964,871 B2 | 6/2011 | Iwasaki |
| 8,003,981 B2 | 8/2011 | Iwasaki et al. |
| 8,143,115 B2 | 3/2012 | Omura et al. |
| 8,148,721 B2 | 4/2012 | Hayashi et al. |
| 8,154,024 B2 | 4/2012 | Iwasaki |
| 8,178,926 B2 | 5/2012 | Nakayama |
| 8,188,467 B2 | 5/2012 | Itagaki et al. |
| 8,207,063 B2 | 6/2012 | Cowdery-Corvan et al. |
| 8,232,552 B2 | 7/2012 | Yano et al. |
| 8,304,773 B2 | 11/2012 | Shimada |
| 8,354,674 B2 | 1/2013 | Kimura |
| 8,384,077 B2 | 2/2013 | Yano et al. |
| 8,502,217 B2 | 8/2013 | Sato et al. |
| 8,716,711 B2 | 5/2014 | Iwasaki |
| 8,735,229 B2 | 5/2014 | Son et al. |
| 8,785,240 B2 | 7/2014 | Watanabe |
| 8,962,457 B2 | 2/2015 | Watanabe |
| 8,981,369 B2 | 3/2015 | Yano et al. |
| 9,153,703 B2 | 10/2015 | Kaji et al. |
| 9,905,699 B2 | 2/2018 | Hayashi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0079941 A1 | 4/2004 | Yamazaki et al. |
| 2004/0127038 A1 | 7/2004 | Carcia et al. |
| 2005/0017244 A1 | 1/2005 | Hoffman et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0299702 A1 | 12/2008 | Son et al. |
| 2009/0008638 A1 | 1/2009 | Kang et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0090914 A1 | 4/2009 | Yano et al. |
| 2009/0114910 A1 | 5/2009 | Chang |
| 2009/0134399 A1 | 5/2009 | Sakakura et al. |
| 2009/0152541 A1 | 6/2009 | Maekawa et al. |
| 2009/0189248 A1 | 7/2009 | Kitamura et al. |
| 2009/0278122 A1 | 11/2009 | Hosono et al. |
| 2009/0280600 A1 | 11/2009 | Hosono et al. |
| 2010/0051936 A1 | 3/2010 | Hayashi et al. |
| 2010/0084648 A1 | 4/2010 | Watanabe |
| 2010/0084655 A1 | 4/2010 | Iwasaki et al. |
| 2010/0117999 A1 | 5/2010 | Matsunaga et al. |
| 2010/0123132 A1 | 5/2010 | Nakata et al. |
| 2010/0140611 A1 | 6/2010 | Itagaki et al. |
| 2010/0193785 A1 | 8/2010 | Kimura |
| 2010/0276689 A1 | 11/2010 | Iwasaki |
| 2010/0277448 A1 | 11/2010 | Okamoto et al. |
| 2010/0279462 A1 | 11/2010 | Iwasaki |
| 2011/0256684 A1 | 10/2011 | Iwasaki et al. |
| 2012/0168750 A1 | 7/2012 | Hayashi et al. |
| 2013/0221348 A1 | 8/2013 | Yano et al. |

(56) References Cited

U.S. PATENT DOCUMENTS

| | | |
|---|---|---|
| 2015/0084048 A1 | 3/2015 | Hayashi et al. |
| 2018/0145181 A1 | 5/2018 | Hayashi et al. |

FOREIGN PATENT DOCUMENTS

| | | |
|---|---|---|
| EP | 1737044 A | 12/2006 |
| EP | 1770788 A | 4/2007 |
| EP | 1950177 A | 7/2008 |
| EP | 1976018 A | 10/2008 |
| EP | 2226847 A | 9/2010 |
| EP | 2339639 A | 6/2011 |
| EP | 2816607 A | 12/2014 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2000-277534 A | 10/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2004-304162 A | 10/2004 |
| JP | 2005-217038 A | 8/2005 |
| JP | 2006-060209 A | 3/2006 |
| JP | 2007-073703 A | 3/2007 |
| JP | 2007-103918 A | 4/2007 |
| JP | 2007-123861 A | 5/2007 |
| JP | 2007-519256 | 7/2007 |
| JP | 2007-250983 A | 9/2007 |
| JP | 2007-311404 A | 11/2007 |
| JP | 2008-218495 A | 9/2008 |
| JP | 2008-243928 A | 10/2008 |
| JP | 2008-276212 A | 11/2008 |
| JP | 2008-281988 A | 11/2008 |
| JP | 2008-283046 A | 11/2008 |
| JP | 2008-300518 A | 12/2008 |
| JP | 2009-016844 A | 1/2009 |
| JP | 2009-135380 A | 6/2009 |
| JP | 2009-141001 A | 6/2009 |
| JP | 2009-141002 A | 6/2009 |
| JP | 2009-141221 A | 6/2009 |
| JP | 2009-212476 A | 9/2009 |
| JP | 2009-224479 A | 10/2009 |
| JP | 2009-266938 A | 11/2009 |
| KR | 2008-0053355 A | 6/2008 |
| KR | 2008-0104588 A | 12/2008 |
| TV | 200937638 | 9/2009 |
| TW | 200841475 | 10/2008 |
| TW | 200915576 | 4/2009 |
| TW | 200917419 | 4/2009 |
| TW | 200941724 | 10/2009 |
| WO | WO-2004/114391 | 12/2004 |
| WO | WO-2005/015643 | 2/2005 |
| WO | WO-2005/074038 | 8/2005 |
| WO | WO-2007/029844 | 3/2007 |
| WO | WO-2007/058248 | 5/2007 |
| WO | WO-2007/119386 | 10/2007 |
| WO | WO-2008/069056 | 6/2008 |
| WO | WO-2008/069255 | 6/2008 |
| WO | WO-2008/091504 | 7/2008 |
| WO | WO-2008/105250 | 9/2008 |
| WO | WO-2008/126879 | 10/2008 |
| WO | WO-2008/126884 | 10/2008 |
| WO | WO-2008/143021 | 11/2008 |
| WO | WO-2008/149754 | 12/2008 |
| WO | WO-2009/072532 | 6/2009 |
| WO | WO-2009/072533 | 6/2009 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn]at Temperatures Over 1000° C", Journal of Solid State Chemistry, 1985, vol. 60, pp. 382-384.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices employing MoO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED ", IDW '06 Proceedings of the 13th International Display Workshops, Dec. 7, 2006, pp. 663-666.

Hosono.H, "68,3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

(56) References Cited

OTHER PUBLICATIONS

Park.S et al., "Challenge to Future Displays: Transparent AM-OLED Driven by PEALD Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al,, "UHF RFCPUS on Flexible and Glass Substrates for Secure RFID Systems", Journal of Solid-State Circuits, 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 :SID International Symposium Digest of TEchnical Papers, May 31, 2009, pp. 395-398.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193

Cho.D et al., "21.2:AL and SN-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 164-187.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 86, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B. (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch Qvga Amoled Driven by the Threshold Voltage Controlled Amorphous GIZO (Ga2O3—In2O3—ZnO) TFT", SID Digest '08 : SID International Symposium Digest of Technical Papers, May 20, 2008, vol. 38, pp. 633-636.

Park.S et al., "42.3: Transparent ZnO Thin Film Transistor for the Application of High Aperture Ratio Bottom Emission AM-OLED

(56) References Cited

OTHER PUBLICATIONS

Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZNO Thin-Film Transistors Produced at Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZNO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

International Search Report (Application No. PCT/JP2010/072595) dated Feb. 1, 2011.

Written Opinion (Application No. PCT/JP2010/072595) dated Feb. 1, 2011.

Taiwanese Office Action (Application No. 099143057) dated Dec. 15, 2015.

Taiwanese Office Action (Application No. 105127071) dated Jan. 25, 2017.

Korean Office Action (Application No. 2012-7017573) dated Mar. 21, 2017.

Korean Office Action (Application No. 2012-7017573) dated Sep. 25, 2017.

Korean Office Action (Application No. 2018-7012749) dated May 30, 2018.

* cited by examiner

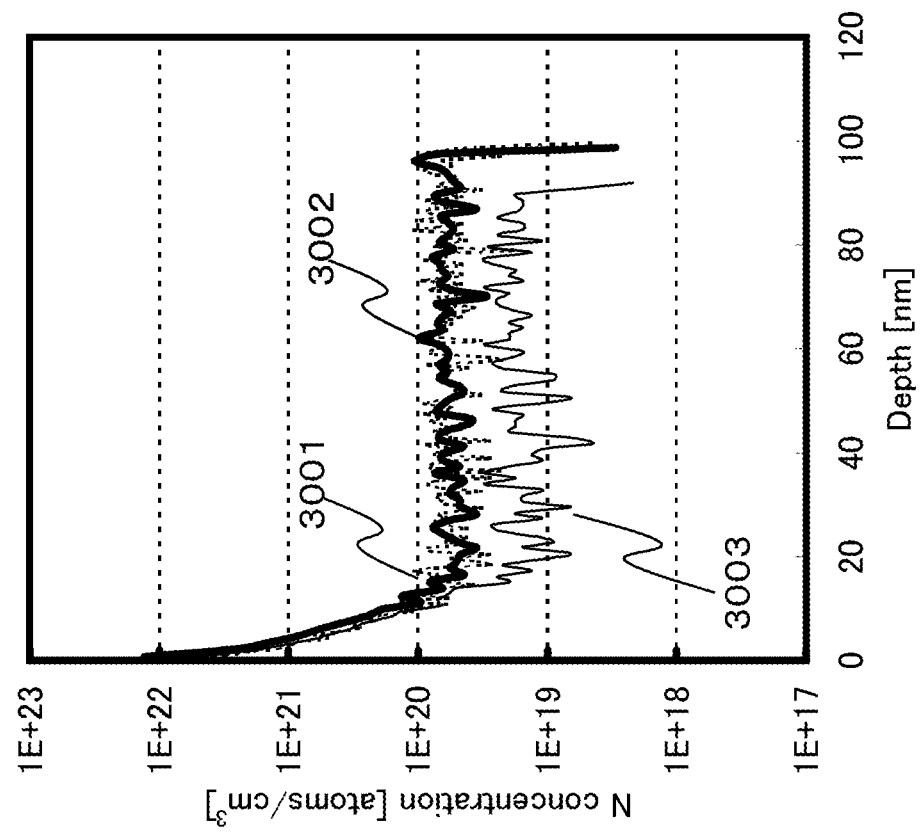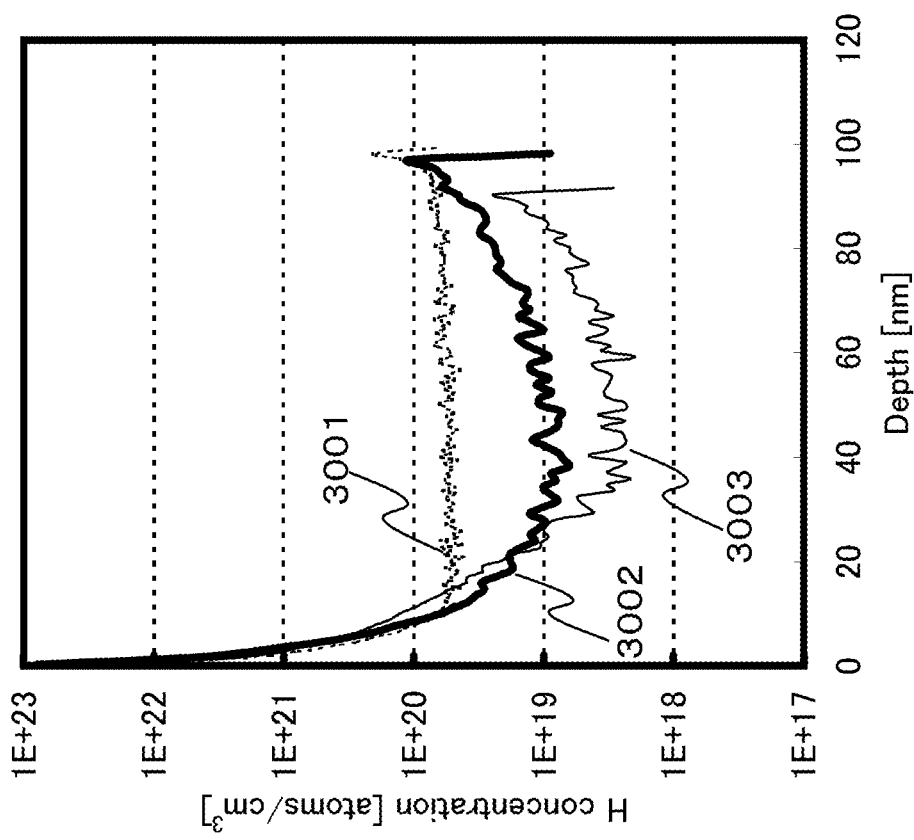

SEMICONDUCTOR DEVICE AND METHOD FOR MANUFACTURING THE SAME

TECHNICAL FIELD

The present invention relates to an oxide semiconductor.

BACKGROUND ART

A semiconductor device including an oxide semiconductor is disclosed in Patent Document 1.

REFERENCE

Patent Document

[Patent Document 1] Japanese Published Patent Application No. 2007-123861

DISCLOSURE OF INVENTION

Many of the physical properties of a silicon semiconductor have already been understood, whereas many of the physical properties of an oxide semiconductor have been still unclear.

In particular, an adverse effect of an impurity on an oxide semiconductor has been still unclear.

In view of the above, a structure will be disclosed in which an impurity that influences electrical characteristics of a semiconductor device including an oxide semiconductor layer is prevented or is eliminated.

There are two factors of carriers in an oxide semiconductor layer.

The first factor is oxygen deficiency in an oxide semiconductor layer.

The second factor is a donor element or an acceptor element in an oxide semiconductor layer.

Here, a hydrogen element serves as a carrier (a donor) in an oxide semiconductor layer.

Further, since a hydrogen element has a reducing character, it also serves as an element causing oxygen deficiency.

Therefore, it is said that a substance containing a hydrogen element is an element which prevents an oxide semiconductor layer from being highly purified so that the oxide semiconductor layer is not close to an i-type oxide semiconductor layer because a hydrogen element has two factors of inducing carriers.

Note that as a substance containing a hydrogen element, for example, hydrogen, moisture, hydroxide, hydride, and the like can be given.

As a result of research, the present inventors found that, surprisingly, hydrogen is more likely to enter an oxide semiconductor layer when a large amount of nitrogen is contained in the oxide semiconductor layer.

Conversely, hydrogen is less likely to enter an oxide semiconductor layer in which the nitrogen concentration is reduced.

Specifically, the nitrogen concentration in an oxide semiconductor layer measured by secondary ion mass spectrometry (SIMS) is set to $1\times10^{20}$ atoms/cm$^3$ or less (or less than $1\times10^{20}$ atoms/cm$^3$), whereby an oxide semiconductor layer which is difficult for hydrogen to enter can be formed.

That is, a semiconductor device which includes a gate electrode, an oxide semiconductor layer, and a gate insulating layer provided between the gate electrode and the oxide semiconductor layer and in which the nitrogen concentration in the oxide semiconductor layer is $1\times10^{20}$ atoms/cm$^3$ or less can be provided.

A semiconductor device which includes a gate electrode, a gate insulating layer provided over the gate electrode, an oxide semiconductor layer provided over the gate insulating layer, and a pair of contact electrodes provided over the oxide semiconductor layer and in which the nitrogen concentration in the oxide semiconductor layer is $1\times10^{20}$ atoms/cm$^3$ or less can be provided.

A semiconductor device which includes a gate electrode, a gate insulating layer provided over the gate electrode, a pair of contact electrodes provided over the gate insulating layer, and an oxide semiconductor layer provided over the gate insulating layer and the pair of contact electrodes and in which the nitrogen concentration in the oxide semiconductor layer is $1\times10^{20}$ atoms/cm$^3$ or less can be provided.

A semiconductor device which includes a gate electrode, a gate insulating layer provided over the gate electrode, an oxide semiconductor layer provided over the gate insulating layer, a channel protective layer provided over the oxide semiconductor layer, and a pair of contact electrodes provided over the oxide semiconductor layer and the channel protective layer and in which the nitrogen concentration in the oxide semiconductor layer is $1\times10^{20}$ atoms/cm$^3$ or less can be provided.

In addition, the semiconductor device in which the hydrogen concentration in the oxide semiconductor layer is $6\times10^{18}$ atoms/cm$^3$ or less can be provided.

A method for manufacturing a semiconductor device including a gate electrode, an oxide semiconductor layer, and a gate insulating layer provided between the gate electrode and the oxide semiconductor layer, which includes the step of performing heat treatment on the oxide semiconductor layer having a nitrogen concentration of $1\times10^{20}$ atoms/cm$^3$ or less at 350° C. or higher for 1 hour or longer, can be provided.

A method for manufacturing a semiconductor device including a gate electrode, an oxide semiconductor layer, and a gate insulating layer provided between the gate electrode and the oxide semiconductor layer, which includes the step of performing heat treatment on the oxide semiconductor layer having a nitrogen concentration of $1\times10^{20}$ atoms/cm$^3$ or less at 450° C. or higher for 1 hour or longer, can be provided.

A method for manufacturing a semiconductor device including a gate electrode, an oxide semiconductor layer, and a gate insulating layer provided between the gate electrode and the oxide semiconductor layer, which includes the step of performing heat treatment on the oxide semiconductor layer having a nitrogen concentration of $1\times10^{20}$ atoms/cm$^3$ or less at 550° C. or higher for 1 hour or longer, can be provided.

A method for manufacturing a semiconductor device including a gate electrode, an oxide semiconductor layer, and a gate insulating layer provided between the gate electrode and the oxide semiconductor layer, which includes the step of performing heat treatment on the oxide semiconductor layer having a nitrogen concentration of $1\times10^{20}$ atoms/cm$^3$ or less at 650° C. or higher for 3 minutes or longer, can be provided.

The nitrogen concentration in an oxide semiconductor layer is reduced, whereby an oxide semiconductor layer which is difficult for hydrogen to enter can be formed.

In other words, the nitrogen concentration in an oxide semiconductor layer is reduced, whereby hydrogen can be prevented from entering the oxide semiconductor layer.

BRIEF DESCRIPTION OF DRAWINGS

FIGS. 10A and 10B each show SIMS data.

BEST MODE FOR CARRYING OUT THE INVENTION

Figure 1A:
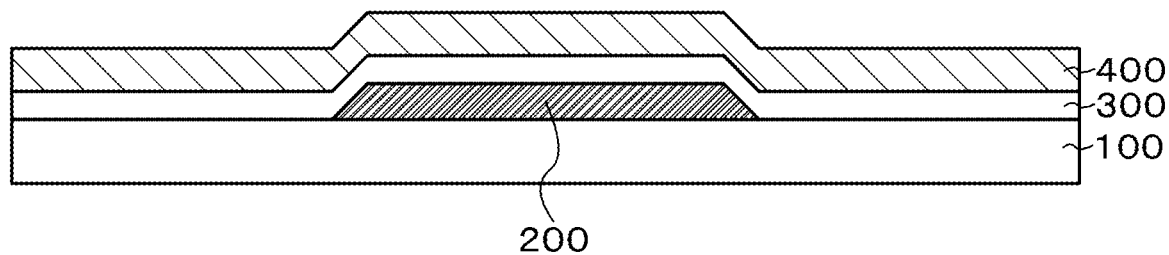
FIGS. 1A to 1C show an example of a method for manufacturing a semiconductor device.

Embodiments and examples will be described in detail with reference to the accompanying drawings.

It is easily understood by those skilled in the art that modes and details of the present invention can be modified in various ways without departing from the spirit of the present invention.

Therefore, the present invention should not be interpreted as being limited to the description of the embodiments and examples below.

Note that in the structures described below, the same portions or portions having similar functions are denoted by the same reference numerals in different drawings, and explanation thereof will not be repeated.

The following embodiments and examples can be combined with each other, as appropriate.

Embodiment 1

An example of a method for manufacturing a semiconductor device will be described.

First, a gate electrode 200 is formed over a substrate 100 having an insulating surface. Then, a gate insulating layer 300 is formed over the gate electrode 200, and an oxide semiconductor layer 400 is formed over the gate insulating layer 300 (FIG. 1A).

As the substrate, any material can be used. For example, a glass substrate, a quartz substrate, a metal substrate, a plastic substrate, or a semiconductor substrate can be used, but the substrate is not limited to these examples.

In the case where an insulating substrate is used as the substrate, the substrate has an insulating surface.

On the other hand, in the case where a metal substrate, a semiconductor substrate, or the like is used as the substrate, the substrate can have an insulating surface when a base insulating layer is formed over the substrate.

Note that a base insulating layer may be formed over the substrate also in the case where an insulating substrate is used as the substrate.

As the gate electrode, any material having conductivity can be used. For example, aluminum, titanium, molybdenum, tungsten, gold, silver, copper, silicon, a variety of alloys, or an oxide conductive layer (typically, indium tin oxide and the like) can be used, but the gate electrode is not limited to these examples. The gate electrode may have a single-layer structure or a stacked-layer structure.

As the gate insulating layer, any material having an insulating property can be used. For example, a silicon oxide film, a silicon nitride film, a silicon oxide film containing nitrogen, a silicon nitride film containing oxygen, an aluminum nitride film, an aluminum oxide film, a hafnium oxide film, or the like can be used, but the gate insulating layer is not limited to these examples. The gate insulating layer may have a single-layer structure or a stacked-layer structure.

Note that the amount of hydrogen and nitrogen in the gate insulating layer is preferably small so that injection of carriers into the oxide semiconductor layer can be prevented.

The gate insulating layer in which the amount of hydrogen is small is preferably formed using a deposition gas which does not contain hydrogen (H) or hydride (e.g., $SiH_4$).

The gate insulating layer in which the amount of nitrogen is small is preferably formed using a deposition gas which does not contain nitrogen (N) or nitride (e.g., $N_2O$ or $NH_4$).

Therefore, when attention is focused on the point that the amount of hydrogen is small, a gate insulating film formed by a sputtering method is preferably used because hydride (e.g., $SiH_4$) is used in a plasma CVD method.

Further, when attention is focused on the point that the amount of nitrogen is small, an oxide film which does not contain nitrogen is preferably used.

Note that a gate insulating layer formed by a plasma CVD method has fewer defects and has higher film quality than a gate insulating layer formed by a sputtering method.

Therefore, in some cases, transistor characteristics become favorable when a gate insulating layer formed by a plasma CVD method is used.

Thus, a plasma CVD method, a sputtering method, or another method may be used as appropriate as needed.

Note that in the case where a gate insulating layer formed by a plasma CVD method is used, a substance containing a hydrogen element is eliminated from the gate insulating layer when heat treatment is performed; therefore, in the case where a plasma CVD method is used, heat treatment (at higher than or equal to 200° C. and lower than or equal to 1000° C. (preferably, higher than or equal to 300° C. and lower than or equal to 800° C.)) is preferably performed after the gate insulating layer is formed.

Note that as a substance containing a hydrogen element, for example, hydrogen, moisture, hydroxide, hydride, and the like can be given.

Examples of the oxide semiconductor layer include, but not limited to, In—Ga—Zn—O-based oxide (containing indium, gallium, zinc, and oxygen as the main components), In—Sn—Zn—O-based oxide (containing indium, tin, zinc, and oxygen as the main components), In—Al—Zn—O-based oxide (containing indium, aluminum, zinc, and oxygen as the main components), Sn—Ga—Zn—O-based oxide (containing tin, gallium, zinc, and oxygen as the main components), Al—Ga—Zn—O-based oxide (containing aluminum, gallium, zinc, and oxygen as the main components), Sn—Al—Zn—O-based oxide (containing tin, aluminum, zinc, and oxygen as the main components), In—

Zn—O-based oxide (containing indium, zinc, and oxygen as the main components), Sn—Zn—O-based oxide (containing tin, zinc, and oxygen as the main components), Al—Zn—O-based oxide (containing aluminum, zinc, and oxygen as the main components), In—O-based oxide (oxide of indium (indium oxide)), Sn—O-based oxide (oxide of tin (tin oxide)), Zn—O-based oxide (oxide of zinc (zinc oxide)), and the like.

The oxide semiconductor layer can be formed by a sputtering method, an evaporation method, or the like, for example.

The thickness of the oxide semiconductor layer is preferably 5 nm to 1 μm (more preferably, 20 nm to 80 nm).

In the case where the oxide semiconductor layer is formed, careful attention needs to be paid so that nitrogen is not contained in the oxide semiconductor layer.

Specifically, the oxide semiconductor layer is preferably formed so that the nitrogen concentration in the oxide semiconductor layer measured by secondary ion mass spectrometry (SIMS) is $1\times10^{20}$ atoms/cm$^3$ or less (or less than $1\times10^{20}$ atoms/cm$^3$), $5\times10^{19}$ atoms/cm$^3$ or less (or less than $5\times10^{19}$ atoms/cm$^3$), $1\times10^{19}$ atoms/cm$^3$ or less (or less than $1\times10^{19}$ atoms/cm$^3$), $5\times10^{18}$ atoms/cm$^3$ or less (or less than $5\times10^{18}$ atoms/cm$^3$), or $1\times10^{18}$ atoms/cm$^3$ or less (or less than $1\times10^{18}$ atoms/cm$^3$).

Note that nitrogen is less likely to enter the oxide semiconductor layer even in the case where the oxide semiconductor layer is subjected to heat treatment.

Therefore, the nitrogen concentration in the oxide semiconductor layer after the semiconductor device is completed, which is measured by secondary ion mass spectrometry (SIMS), is also preferably $1\times10^{20}$ atoms/cm$^3$ or less (or less than $1\times10^{20}$ atoms/cm$^3$), $5\times10^{19}$ atoms/cm$^3$ or less (or less than $5\times10^{19}$ atoms/cm$^3$), $1\times10^{19}$ atoms/cm$^3$ or less (or less than $1\times10^{19}$ atoms/cm$^3$), $5\times10^{18}$ atoms/cm$^3$ or less (or less than $5\times10^{18}$ atoms/cm$^3$), or $1\times10^{18}$ atoms/cm$^3$ or less (or less than $1\times10^{18}$ atoms/cm$^3$).

Note that as the value of the nitrogen concentration, the average value in the effective range of secondary ion mass spectrometry (SIMS) can be adopted.

Alternatively, as the value of the nitrogen concentration, the maximum value in the effective range of secondary ion mass spectrometry (SIMS) may be adopted (when the maximum value in the effective range is smaller than a predetermined value, the average value in the effective range is also smaller than the predetermined value).

Figure 9:
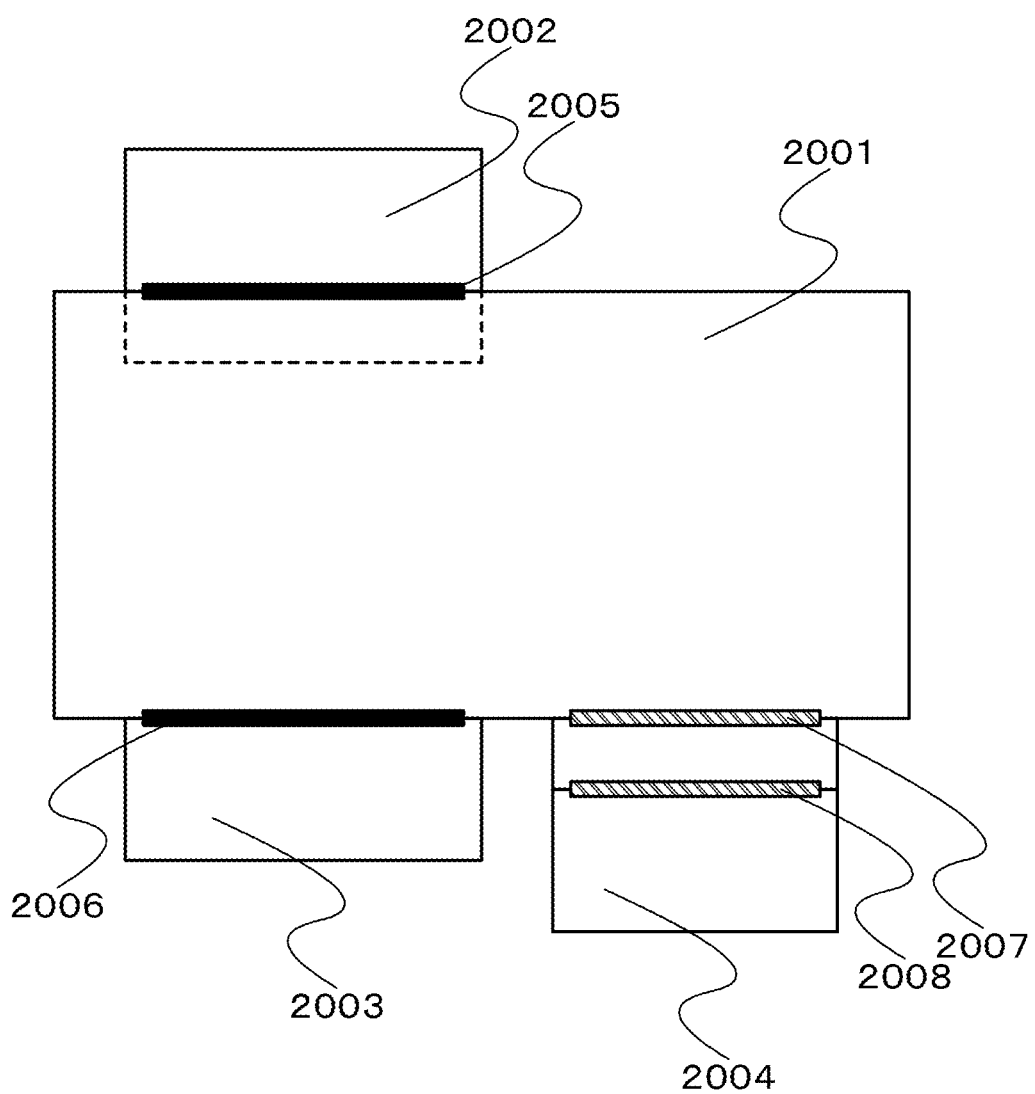
FIG. 9 shows an example of a sputtering apparatus.

Here, an example of a sputtering apparatus is shown in FIG. 9.

The sputtering apparatus in FIG. 9 includes a deposition chamber 2001, a cover 2002, a target 2003, and a pump 2004.

Note that a structure is employed in which a substrate is put to be provided for the cover 2002 and the target 2003 is sputtered for deposition.

The deposition chamber 2001 and the cover 2002 are connected to each other, and an O-ring 2005 is provided for a connecting portion.

The deposition chamber 2001 and the target 2003 are connected to each other, and an O-ring 2006 is provided for a connecting portion.

The deposition chamber 2001 and the pump 2004 are connected to each other, and a metal gasket 2007 and a metal gasket 2008 are provided for connecting portions.

Both the O-rings and the metal gaskets are used to prevent leakage from the connecting portion. In other words, by the O-rings and the metal gaskets, air (in particular, nitrogen) is prevented from entering the deposition chamber 2001.

The O-ring is a ring-like packing. A material thereof is, for example, rubber.

The metal gasket is a ring-like fixing sealant. A material thereof is, for example, metal.

The cover 2002 and the target 2003 are frequently opened and closed; therefore, the O-ring is used because it can be easily put on and taken off.

On the other hand, the pump is hardly opened and closed. Although the metal gasket is not easily put on and taken off, the metal gasket is provided for the pump because it can improve airtightness compared with the O-ring.

In the case where the O-ring or the metal gasket has a chip, a crack, or the like, leakage occurs, so that air outside the deposition chamber 2001 enters the deposition chamber 2001.

Since air contains a large amount of nitrogen, careful attention needs to be paid so that the O-ring or the metal gasket does not have a chip, a crack, or the like in order to prevent air (in particular, nitrogen) due to the chip, the crack, or the like of the O-ring or the metal gasket from entering the deposition chamber 2001.

Although the maintenance needs to be further done, it is effective to replace all the O-rings with metal gaskets which can improve airtightness because air (in particular, nitrogen) can be prevented from entering the deposition chamber 2001.

On the other hand, in the case where nitrogen is attached to or enters the inner wall of the deposition chamber 2001 or a surface of the target 2003 or in the case where nitrogen floats in the deposition chamber 2001 even when air (in particular, nitrogen) is prevented from entering the deposition chamber 2001, nitrogen might enter an oxide semiconductor layer.

Thus, in order to remove nitrogen which is attached to or enters the inner wall of the deposition chamber, the deposition chamber is heated at higher than or equal to 200° C. and lower than or equal to 500° C.

The deposition chamber is heated, whereby nitrogen which is attached to or enters the inner wall of the deposition chamber is released into the deposition chamber.

Then, nitrogen which is released through heating of the deposition chamber is evacuated with the use of the pump 2004, whereby nitrogen which is attached to or enters the inner wall of the deposition chamber can be removed.

Further, after the heat treatment and the evacuation treatment are performed on the deposition chamber and before the oxide semiconductor layer used for a semiconductor device is formed, a step of forming an oxide semiconductor layer over a dummy substrate is preferably performed.

When the step of forming the oxide semiconductor layer over the dummy substrate is performed, nitrogen which is attached to or enters the surface of the target can be removed.

Further, since nitrogen which remains in the deposition chamber due to the step of forming the oxide semiconductor layer over the dummy substrate is taken into the oxide semiconductor layer over the dummy substrate, nitrogen which remains in the deposition chamber can be removed before the oxide semiconductor layer used for the semiconductor device is formed.

After that, the dummy substrate is taken out of the deposition chamber, and the oxide semiconductor layer used for the semiconductor device is formed.

Note that it is effective to perform deposition onto the dummy substrate a plurality of times.

As described above, the reduction of leakage from the deposition chamber, the reduction of nitrogen on the inner wall of the deposition chamber, deposition onto the dummy substrate, or the like is sufficiently performed, so that incorporation of nitrogen into the oxide semiconductor layer can be thoroughly prevented.

Figure 1B:
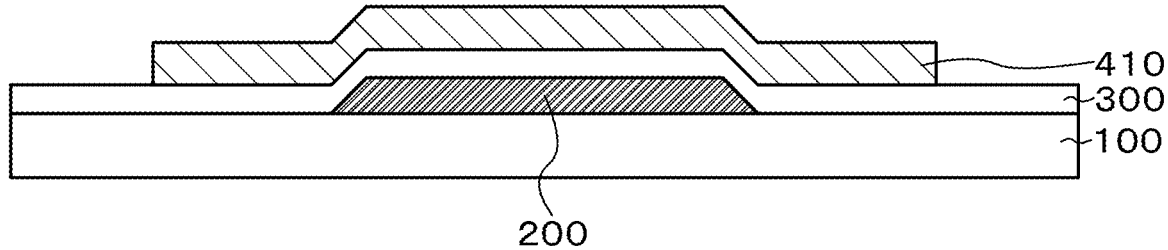

Next, the oxide semiconductor layer 400 is etched into an island shape by a photolithography method, whereby an oxide semiconductor layer 410 is formed (FIG. 1B).

Next, the oxide semiconductor layer is subjected to first heat treatment (at higher than or equal to X° C. and lower than Y° C.).

A nitrogen atmosphere, a rare gas atmosphere, an oxygen atmosphere, an atmosphere containing oxygen and nitrogen, an atmosphere containing oxygen and a rare gas, an atmosphere containing nitrogen and a rare gas, an atmosphere containing oxygen, nitrogen, and a rare gas, or the like can be selected as appropriate for the atmosphere in which the first heat treatment is performed.

The first heat treatment may be performed before the oxide semiconductor layer 400 is etched into an island shape to form the oxide semiconductor layer 410.

On the other hand, through the step of etching the oxide semiconductor layer 400 into an island shape to form the oxide semiconductor layer 410 by a photolithography method, the oxide semiconductor layer is immersed in moisture of a photoresist and a stripping solution.

Therefore, in order to remove moisture due to the photoresist and the stripping solution, it is more preferable that the first heat treatment be performed after the oxide semiconductor layer 400 is etched into an island shape to form the oxide semiconductor layer 410.

The lower limit (X° C.) of the temperature of the first heat treatment can be set to 350° C. or higher (or higher than 350° C.), 400° C. or higher (or higher than 400° C.), 450° C. or higher (or higher than 450° C.), 500° C. or higher (or higher than 500° C.), 550° C. or higher (or higher than 550° C.), 600° C. or higher (or higher than 600° C.), 650° C. or higher (or higher than 650° C.), 700° C. or higher (or higher than 700° C.), or 750° C. or higher (or higher than 750° C.).

The first heat treatment is preferably performed by a heating method with the use of a furnace, an oven, gas RTA, or the like.

Gas RTA refers to a method in which an object is put in a gas heated at high temperature for a short time (several minutes to several tens of minutes) to be rapidly heated.

There is no particular limitation on the upper limit of the temperature of the first heat treatment because the temperature of the first heat treatment is preferably high.

However, the upper limit (Y° C.) of the temperature of the first heat treatment is preferably lower than the allowable temperature limit of the substrate.

Further, the upper limit (Y° C.) of the temperature of the first heat treatment can be set to 1000° C. or lower (or lower than 1000° C.), 900° C. or lower (or lower than 900° C.), 800° C. or lower (or lower than 800° C.), or 700° C. or lower (or lower than 700° C.).

The heating time of the first heat treatment is preferably 1 hour or longer. The upper limit of the heating time is not particularly limited, but can be set to 10 hours or shorter, 9 hours or shorter, or 8 hours or shorter in consideration of reduction in process time.

In the case where the first heat treatment is performed with the use of gas RTA, the heating time of the first heat treatment is preferably 3 minutes or longer. The upper limit of the heating time is not particularly limited, but can be set to 1 hour or shorter, 50 minutes or shorter, or 40 minutes or shorter.

When the measurement is performed by thermal desorption spectroscopy (TDS), a sample on which baking has been performed at 450° C. for 1 hour does not have a peak of moisture at around 300° C. A sample on which baking has been performed at 650° C. for 3 minutes with the use of gas RTA also does not have a peak of moisture at around 300° C. On the other hand, a sample on which baking has been performed at 350° C. for 1 hour has a peak of moisture at around 300° C.

When the measurement is performed by secondary ion mass spectrometry (SIMS), the hydrogen concentration in a sample on which baking has been performed at 550° C. for 1 hour is lower than that in a sample on which baking has been performed at 450° C. for 1 hour by almost 1 digit.

In other words, the oxide semiconductor layer in which the nitrogen concentration is reduced is subjected to the first heat treatment under a predetermined condition, whereby substances containing a hydrogen element which adversely affect electrical characteristics of a transistor can be drastically reduced.

Note that the higher the energy which is applied to the oxide semiconductor is, the more substances containing a hydrogen element are likely to be eliminated; therefore, the heating temperature is preferably high and the heating time is preferably long.

The hydrogen concentration in the oxide semiconductor layer after the first heat treatment is preferably $6\times10^{18}$ atoms/cm$^3$ or less (or less than $6\times10^{18}$ atoms/cm$^3$), $5\times10^{18}$ atoms/cm$^3$ or less (or less than $5\times10^{18}$ atoms/cm$^3$), $4\times10^{18}$ atoms/cm$^3$ or less (or less than $4\times10^{18}$ atoms/cm$^3$), $3\times10^{18}$ atoms/cm$^3$ or less (or less than $3\times10^{18}$ atoms/cm$^3$), $1\times10^{16}$ atoms/cm$^3$ or less (or less than $1\times10^{16}$ atoms/cm$^3$), $1\times10^{14}$ atoms/cm$^3$ or less (or less than $1\times10^{14}$ atoms/cm$^3$), or $1\times10^{12}$ atoms/cm$^3$ or less (or less than $1\times10^{12}$ atoms/cm$^3$).

The oxide semiconductor layer in which the nitrogen concentration is reduced can prevent incorporation of hydrogen in steps after the first heat treatment.

Thus, the hydrogen concentration in the oxide semiconductor layer after the semiconductor device is completed is also preferably $6\times10^{18}$ atoms/cm$^3$ or less (or less than $6\times10^{18}$ atoms/cm$^3$), $5\times10^{18}$ atoms/cm$^3$ or less (or less than $5\times10^{18}$ atoms/cm$^3$), $4\times10^{18}$ atoms/cm$^3$ or less (or less than $4\times10^{18}$ atoms/cm$^3$), $3\times10^{18}$ atoms/cm$^3$ or less (or less than $3\times10^{18}$ atoms/cm$^3$), $1\times10^{16}$ atoms/cm$^3$ or less (or less than $1\times10^{16}$ atoms/cm$^3$), $1\times10^{14}$ atoms/cm$^3$ or less (or less than $1\times10^{14}$ atoms/cm$^3$), or $1\times10^{12}$ atoms/cm$^3$ or less (or less than $1\times10^{12}$ atoms/cm$^3$).

Note that as the value of the hydrogen concentration, the average value in the effective range of secondary ion mass spectrometry (SIMS) can be adopted.

Alternatively, as the value of the hydrogen concentration, the maximum value in the effective range of secondary ion mass spectrometry (SIMS) may be adopted (when the maximum value in the effective range is smaller than a predetermined value, the average value in the effective range is also smaller than the predetermined value).

Note that the smaller the quantity of substances containing a hydrogen element in the oxide semiconductor layer is, the more electrical characteristics of the transistor including the oxide semiconductor layer are improved.

Figure 1C:
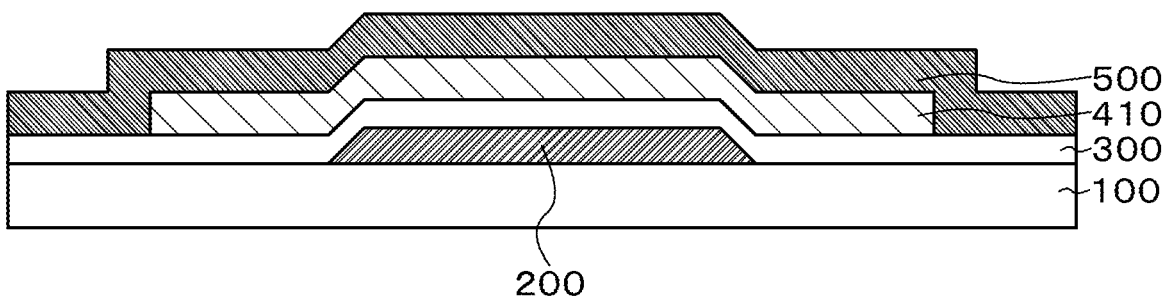

Next, a conductive layer 500 is formed over the oxide semiconductor layer 410 (FIG. 1C).

As the conductive layer, any material having conductivity can be used. For example, aluminum, titanium, molybdenum, tungsten, yttrium, indium, gold, silver, copper, silicon, a variety of alloys containing any of these metals, an oxide conductive layer (typically, indium tin oxide), or the like can be used, but the conductive layer is not limited to these examples. The conductive layer may have a single-layer structure or a stacked-layer structure.

Note that the conductive layer in contact with the oxide semiconductor layer is formed using titanium, indium, yttrium, an indium-zinc alloy, an alloy containing gallium (e.g., gallium nitride), or the like, whereby the contact resistance between the oxide semiconductor layer and an electrode (a wiring) which is formed by etching of the conductive layer can be reduced.

The reason why the contact resistance can be reduced is that the electron affinity of titanium, indium, yttrium, an indium-zinc alloy, an alloy containing gallium (e.g., gallium nitride), or the like is lower than that of the oxide semiconductor layer.

That is, in the case of a single layer, a metal (or an alloy, a compound) having lower electron affinity than the oxide semiconductor layer is preferable.

On the other hand, in the case of a stacked layer, a metal (or an alloy, a compound) having lower electron affinity than the oxide semiconductor layer is preferably disposed to be in contact with the oxide semiconductor layer.

Since titanium (Ti), indium (In), yttrium (Y), an indium-zinc alloy (an In—Zn alloy), an alloy containing gallium (Ga) (e.g., gallium nitride), or the like has high resistivity, a material having low resistivity such as aluminum (Al), gold (Au), silver (Ag), copper (Cu), or a variety of alloys containing any of these metals is preferably stacked over the conductive layer which is disposed to be in contact with the oxide semiconductor layer.

Specifically, the following examples can be given, but not limited to, a structure in which Ti and Al are sequentially stacked, a structure in which Ti and an alloy containing Al are sequentially stacked, a structure in which Y and Al are sequentially stacked, a structure in which Y and an alloy containing Al are sequentially stacked, a structure in which Ti, Al, and Ti are sequentially stacked, a structure in which Ti, an alloy containing Al, and Ti are sequentially stacked, a structure in which In, Al, and Mo are sequentially stacked, a structure in which Y, Al, and Ti are sequentially stacked, a structure in which Mo, Al, and Ti are sequentially stacked, and a structure in which Ti, an alloy containing Al, Mo, and Ti are sequentially stacked.

Note that the alloy having low resistivity refers to an alloy containing aluminum, gold, silver, copper, or the like and another substance (e.g., Al—Si, Al—Ti, Al—Nd, Cu—Pb—Fe, or Cu—Ni).

Note that the oxide conductive layer can be formed using a material similar to the material of the oxide semiconductor layer.

There is no particular limitation on the oxide conductive layer as long as the resistivity of the oxide conductive layer is lower than that of the oxide semiconductor layer serving as a channel formation region.

Here, the oxide conductive layer is oxide which is intentionally made to contain a large quantity of substances containing a hydrogen element or a large quantity of oxygen deficiency. Substances containing a hydrogen element and oxygen deficiency induce carriers, so that the conductivity of the oxide can be raised.

The oxide semiconductor layer is oxide which is intentionally made not to contain substances containing a hydrogen element or oxygen deficiency.

That is, the quantity of substances containing a hydrogen element or oxygen deficiency in the oxide semiconductor layer is controlled, whereby the resistivity can be controlled.

Note that in the case where the oxide conductive layer and the oxide semiconductor layer serving as a channel formation region are formed using different materials and the oxide conductive layer has lower resistivity than the oxide semiconductor layer serving as a channel formation region, the resistivity does not need to be controlled by control of the quantity of substances containing a hydrogen element or oxygen deficiency in the oxide semiconductor layer.

Figure 2A:
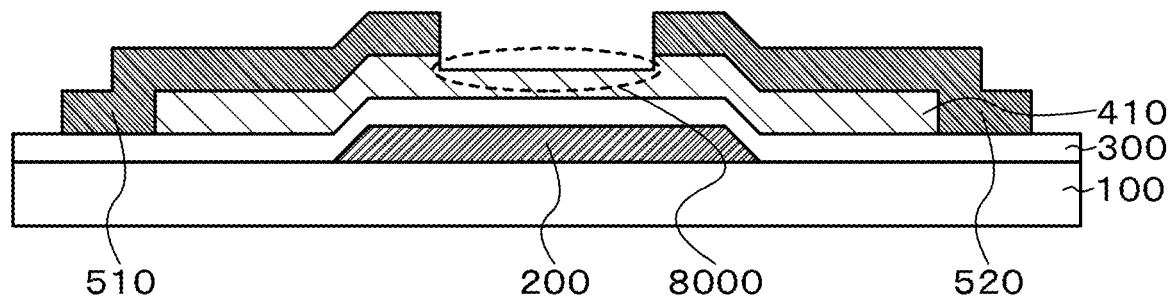
FIGS. 2A and 2B show an example of a method for manufacturing a semiconductor device.

Next, the conductive layer 500 is etched to form a plurality of electrodes or a plurality of wirings (a source electrode (a contact electrode), a drain electrode (a contact electrode), a wiring, and the like) (FIG. 2A). Note that in FIG. 2A, a contact electrode 510, a contact electrode 520, and the like are shown.

By the step of FIG. 2A, a transistor (a channel-etched transistor) is completed.

Figure 2B:
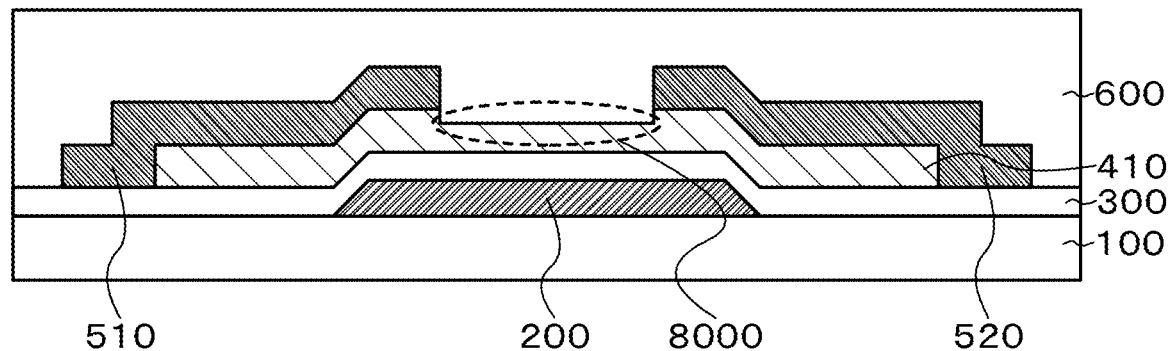

Note that a portion surrounded by a dashed line 8000 in FIGS. 2A and 2B is slightly etched at the time of etching the conductive layer 500.

The portion surrounded by the dashed line 8000 is called a back channel because it is disposed on the rear side of the channel formation region.

Next, an insulating layer 600 (a protective layer or an interlayer insulating film) is formed to cover the transistor (FIG. 2B).

As the insulating layer, any material having an insulating property can be used. For example, a silicon oxide film, a silicon nitride film, a silicon oxide film containing nitrogen, a silicon nitride film containing oxygen, an aluminum nitride film, an aluminum oxide film, a siloxane film, an acrylic film, a polyimide film, or the like can be used, but the insulating layer is not limited to these examples. The interlayer insulating film may have a single-layer structure or a stacked-layer structure.

Here, the kind of insulating layer is changed to compare electrical characteristics of transistors. It is found that a film which is formed without using a substance containing a hydrogen element as a sputtering gas is preferably used for the insulating layer in a portion in contact with the back channel (the portion surrounded by the dashed line 8000).

When a substance containing a hydrogen element is contained in the back channel, the threshold voltage (Vth) of the transistor shifts in a negative direction.

Since a deposition gas containing a hydrogen element (typically, $SiH_4$ or the like) is used in a plasma CVD method, a substance containing a hydrogen element is added to the back channel when the insulating layer is formed by a plasma CVD method.

A siloxane film, an acrylic film, a polyimide film, or the like contains a large amount of moisture; therefore, a substance containing a hydrogen element is constantly supplied to the back channel if any of these films is employed.

That is, a film in which the quantity of substances containing a hydrogen element is small is preferably used for the insulating layer in contact with the back channel.

Note that the step of FIG. 2B corresponds to a step of forming the insulating layer 600 over the contact electrode 510, the contact electrode 520, and the back channel (the portion surrounded by the dashed line 8000).

Figure 3A:
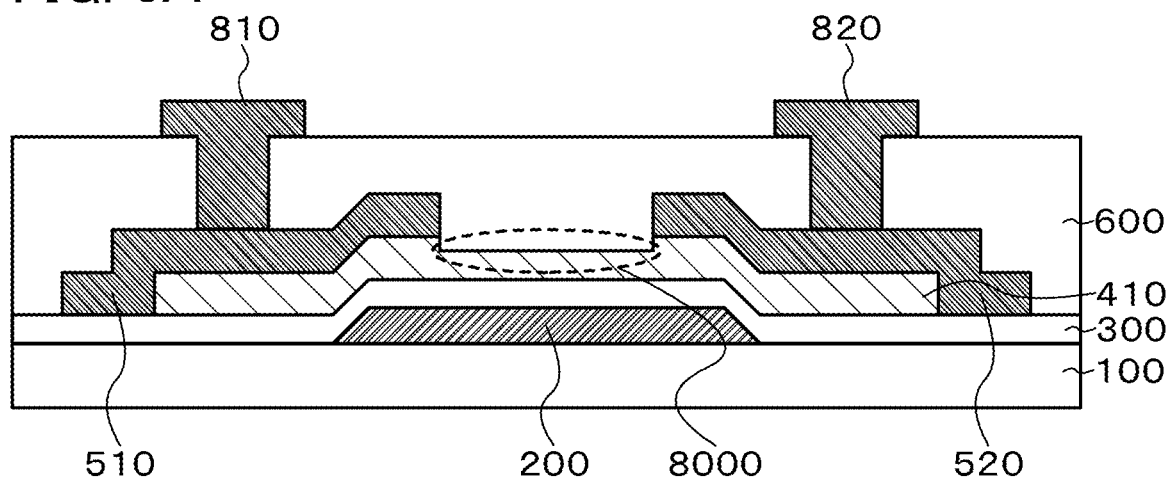
FIGS. 3A and 3B show an example of a method for manufacturing a semiconductor device.

A structure may be employed in which, after the step of FIG. 2B, contact holes are formed in the insulating layer 600 and a wiring 810, a wiring 820, and the like are formed over the insulating layer 600 (FIG. 3A).

Figure 3B:
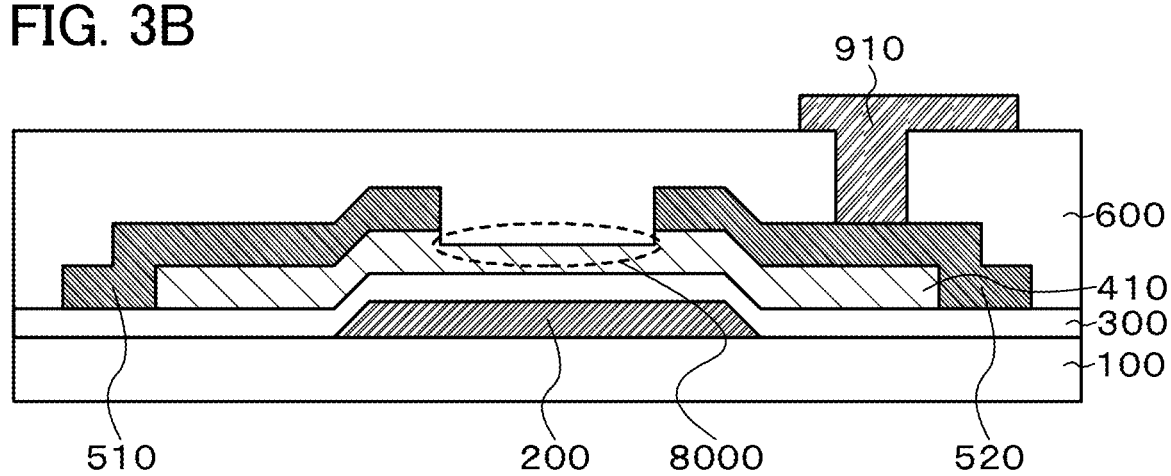

Alternatively, a structure may be employed in which, after the step of FIG. 2B, a contact hole is formed in the insulating layer 600 and a pixel electrode 910 is formed over the insulating layer 600 (FIG. 3B).

After the wirings are formed over the insulating layer 600 as illustrated in FIG. 3A, an insulating layer, a wiring, a transistor, a display element, an antenna, or the like may be further formed over the wirings.

After the pixel electrode 910 is formed as illustrated in FIG. 3B, a display element (e.g., an EL element or a liquid crystal element) is formed, whereby a display device can be formed.

After the step of FIG. 3A or FIG. 3B, second heat treatment is preferably performed.

The second heat treatment may be performed between the step of FIG. 2B and the step of FIG. 3A or FIG. 3B.

In other words, the timing of the second heat treatment is not particularly limited as long as it is performed after the insulating layer 600 is formed.

The second heat treatment is preferably performed at higher than or equal to 150° C. and lower than or equal to 500° C. (preferably higher than or equal to 200° C. and lower than or equal to 300° C.).

The heating time of the second heat treatment is preferably longer than or equal to 1 hour and shorter than or equal to 10 hours.

The second heat treatment is preferably performed using a furnace, an oven, gas RTA, or the like.

Note that hydrogen in the oxide semiconductor layer is released and oxygen in the oxide semiconductor layer is also released by the first heat treatment which has been performed previously.

That is, by the first heat treatment, oxygen deficiency is formed in the oxide semiconductor layer.

Thus, when the second heat treatment is performed, the insulating layer is made to be in an oxygen-excess state; therefore, oxygen can be supplied to the oxide semiconductor layer and oxygen deficiency in the oxide semiconductor layer can be reduced.

Examples of the formation method of the insulating layer containing excessive oxygen include, but are not limited to, a method in which, in the case where a non-oxide target (silicon, aluminum, or the like) is used as a sputtering target and oxygen is used as a sputtering gas for reactive sputtering, the flow rate of oxygen is increased; a method in which an oxide target (silicon oxide, aluminum oxide, or the like) is used as a sputtering target and oxygen is used as a sputtering gas (in the case where an oxide target is used, oxygen is not used as a sputtering gas in general); and a method in which an insulating layer is formed and oxygen is introduced into the insulating layer by ion implantation or ion doping (note that in the case where reactive sputtering is performed, a gas such as argon is not preferably used so that a sputtering gas contains oxygen at 100%).

That is, a method in which oxygen is used as a deposition gas for formation of the insulating layer, a method in which oxygen is added to the insulating layer after the insulating layer is formed, or the like may be used. Needless to say, oxygen may be used as a deposition gas for formation of the insulating layer, and in addition, oxygen may be added to the insulating layer after the insulating layer is formed.

Note that in the case where titanium is used for the contact electrode, the second heat treatment is performed after the insulating layer 600 is formed, so that titanium oxide can be formed between the oxide semiconductor layer and titanium.

By formation of titanium oxide, the contact resistance between the oxide semiconductor layer and titanium can be reduced.

Note that when titanium oxide is present between the oxide semiconductor layer and titanium, the contact resistance between the oxide semiconductor layer and titanium can be reduced, so that a structure may be formed in which titanium oxide and titanium are sequentially stacked when the contact electrode is formed.

In this case, titanium oxide can be formed by a sputtering method, an evaporation method, or the like.

The contents of this embodiment or part thereof can be implemented in combination with any of the other embodiments and examples.

Embodiment 2

In this embodiment, a semiconductor device including a transistor which has a structure different from that of the transistor in Embodiment 1 will be described.

Note that materials or the like of the layers are the same as those in Embodiment 1.

Figure 4A:
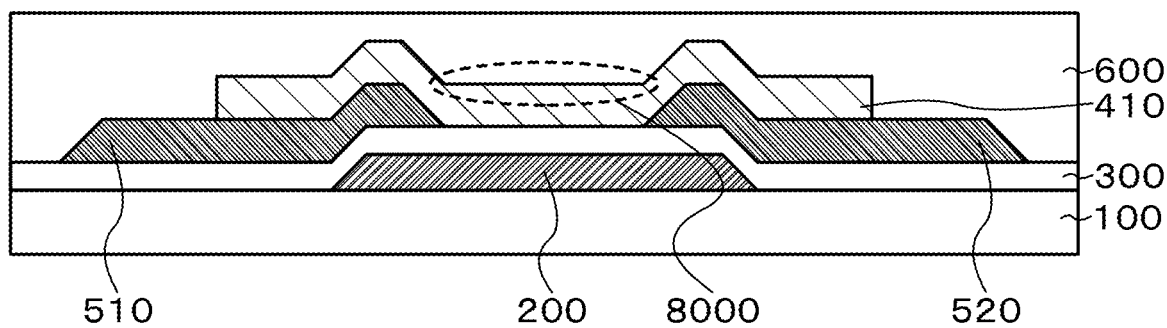
FIGS. 4A to 4C each show an example of a semiconductor device.

A transistor in FIG. 4A is a bottom-gate bottom-contact (BGBC) transistor, and includes the gate electrode 200 provided over the substrate 100 having an insulating surface; the gate insulating layer 300 provided over the gate electrode 200; the contact electrode 510 and the contact electrode 520 provided over the gate insulating layer 300; and the oxide semiconductor layer 410 (island shape) provided over the gate insulating layer 300, the contact electrode 510, and the contact electrode 520.

Note that the insulating layer 600 is provided to cover the transistor.

A portion surrounded by the dashed line 8000 serves as a back channel.

Figure 4B:
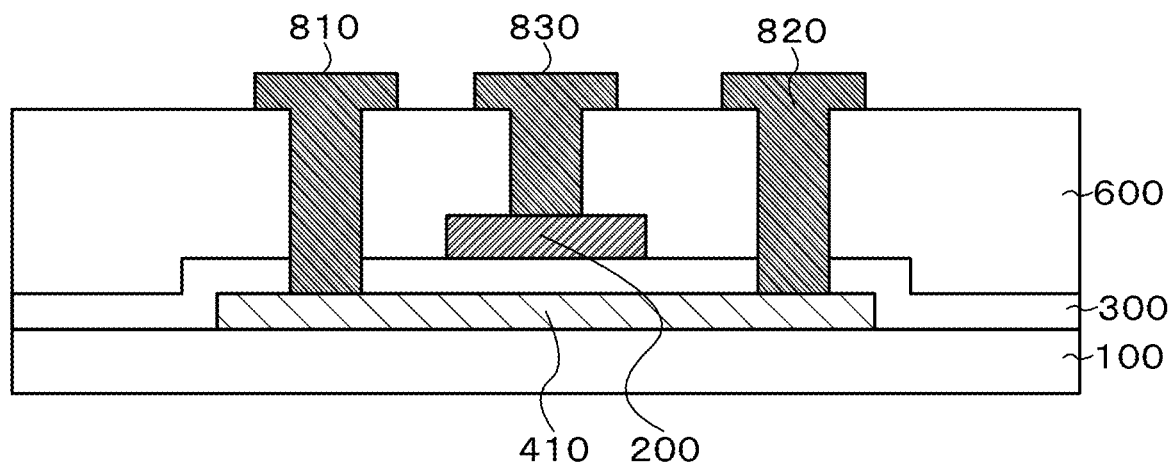

A transistor in FIG. 4B is a top-gate transistor, and includes the oxide semiconductor layer 410 (island shape) provided over the substrate 100 having an insulating surface; the gate insulating layer 300 provided over the oxide semiconductor layer 410; and the gate electrode 200 provided over the gate insulating layer 300.

Note that the insulating layer 600 is provided to cover the transistor, and the wiring 810, the wiring 820, and a wiring 830 are provided through contact holes provided in the insulating layer 600.

Figure 4C:
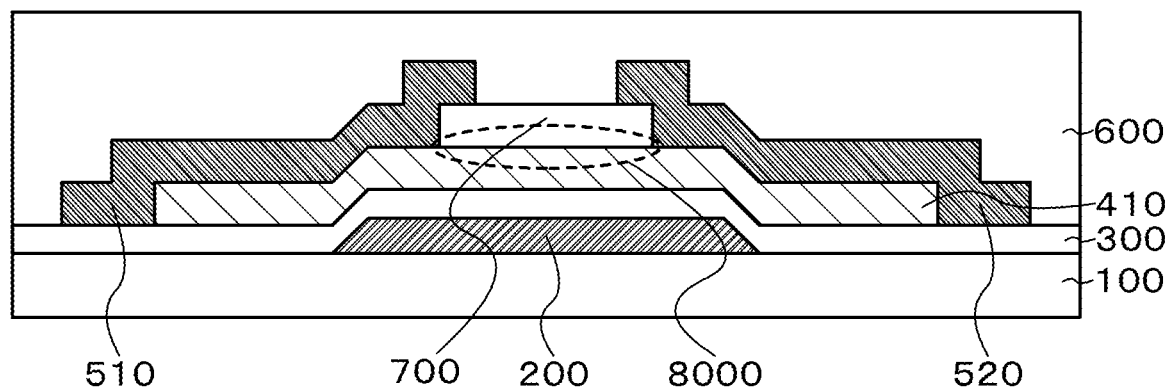

A transistor in FIG. 4C is a channel-stop transistor, and includes the gate electrode 200 provided over the substrate 100 having an insulating surface; the gate insulating layer 300 provided over the gate electrode 200; the oxide semiconductor layer 410 (island shape) provided over the gate insulating layer 300; a channel protective layer 700 provided over the oxide semiconductor layer 410; and the contact electrode 510 and the contact electrode 520 provided over the oxide semiconductor layer 410 and the channel protective layer 700.

Note that the insulating layer 600 is provided to cover the transistor.

A portion surrounded by the dashed line 8000 serves as a back channel.

Here, the channel protective layer 700 can be formed using a material similar to the material of the insulating layer 600 described in Embodiment 1. The channel protective layer 700 and the insulating layer 600 may be formed using either the same material or different materials.

In the channel-stop transistor, a portion in contact with the back channel is not the insulating layer 600 but the channel protective layer 700.

That is, a film in which the quantity of substances containing a hydrogen element is small is preferably used for the channel protective layer 700.

Figure 15A:
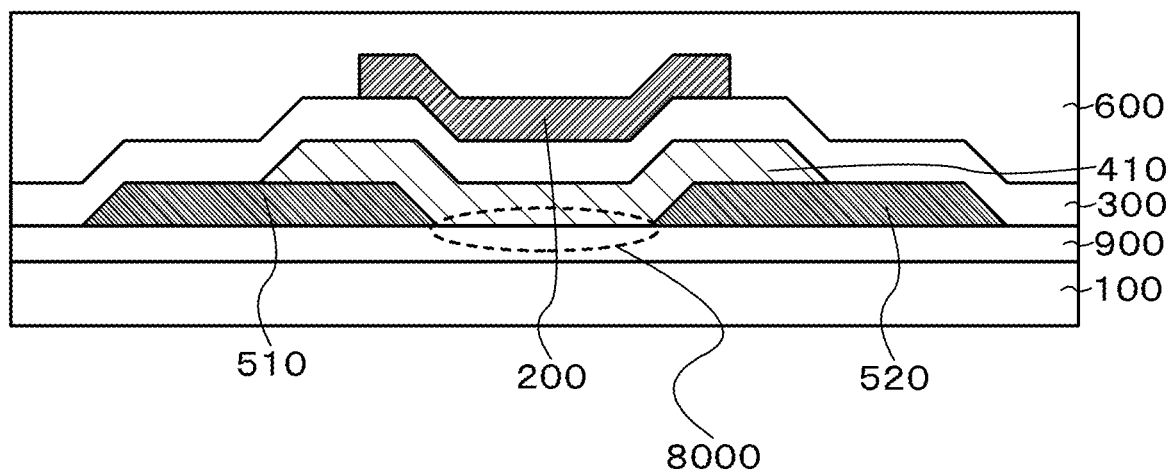
FIGS. 15A and 15B each show an example of a semiconductor device.

A transistor in FIG. 15A is a top-gate bottom-contact (TGBC) transistor, and includes the contact electrode 510 and the contact electrode 520 provided over a base insulating layer 900; the oxide semiconductor layer 410 (island shape) provided over the base insulating layer 900, the contact electrode 510, and the contact electrode 520; the gate insulating layer 300 provided over the oxide semiconductor layer 410; and the gate electrode 200 provided over the gate insulating layer 300.

Note that the base insulating layer 900 is provided over the substrate 100.

The insulating layer 600 is provided to cover the transistor.

A portion surrounded by the dashed line 8000 serves as a back channel.

Here, the base insulating layer 900 can be formed using a material similar to the material of the insulating layer 600 described in Embodiment 1. The base insulating layer 900 and the insulating layer 600 may be formed using either the same material or different materials.

In the top-gate bottom-contact transistor, a portion in contact with the back channel is not the insulating layer 600 but the base insulating layer 900.

That is, a film in which the quantity of substances containing a hydrogen element is small is preferably used for the base insulating layer 900.

The base insulating layer 900 is preferably formed using an insulating layer containing excessive oxygen by a method similar to the method described in Embodiment 1. In this case, when first heat treatment is performed, oxygen is released from the oxide semiconductor layer and oxygen is supplied to the oxide semiconductor layer from the base insulating layer at the same time.

Figure 15B:
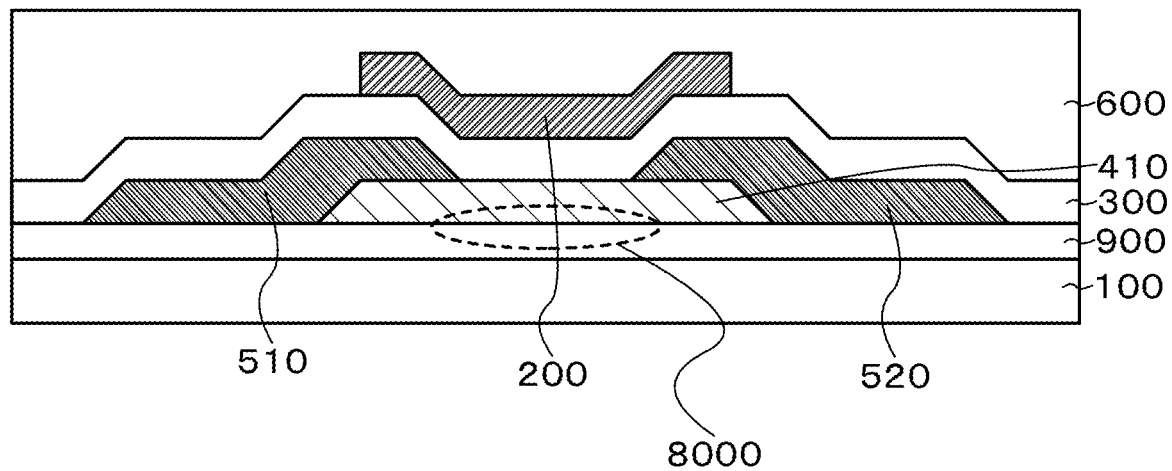

A transistor in FIG. 15B is a top-gate top-contact (TGTC) transistor, and includes the oxide semiconductor layer 410 (island shape) provided over the base insulating layer 900; the contact electrode 510 and the contact electrode 520 provided over the oxide semiconductor layer 410 and the base insulating layer 900; the gate insulating layer 300 provided over the oxide semiconductor layer 410, the contact electrode 510, and the contact electrode 520; and the gate electrode 200 provided over the gate insulating layer 300.

Note that the base insulating layer 900 is provided over the substrate 100.

The insulating layer 600 is provided to cover the transistor.

A portion surrounded by the dashed line 8000 serves as a back channel.

Here, the base insulating layer 900 can be formed using a material similar to the material of the insulating layer 600 described in Embodiment 1. The base insulating layer 900 and the insulating layer 600 may be formed using either the same material or different materials.

In the top-gate top-contact transistor, a portion in contact with the back channel is not the insulating layer 600 but the base insulating layer 900.

That is, a film in which the quantity of substances containing a hydrogen element is small is preferably used for the base insulating layer 900.

Note that in the transistor in FIG. 4B, an off-set region having a width of several micrometers is formed between a channel formation region (a region where the gate electrode and the oxide semiconductor layer overlap with each other) and each of contact regions (regions where the wirings and the oxide semiconductor layer are in contact with each other).

The off-set region has an advantage of reducing off current of the transistor, but it has a disadvantage of reducing also on current of the transistor.

On the other hand, unlike in FIG. 4B, an off-set region is not present in FIGS. 15A and 15B; thus, unlike the transistor in FIG. 4B, the transistors in FIGS. 15A and 15B have an advantage of improving on current.

As described above, the transistor may employ any structure.

In other words, the transistor may employ any structure as long as the transistor includes at least the gate electrode, the oxide semiconductor layer, and the gate insulating layer provided between the gate electrode and the oxide semiconductor layer.

A dual-gate transistor may be employed in which a first gate electrode, a first gate insulating layer over the first gate electrode, an oxide semiconductor layer over the first gate insulating layer, a second gate insulating layer over the oxide semiconductor layer, and a second gate electrode over the second gate insulating layer are provided.

Therefore, the structure of the transistor is not limited to any of the structures described in Embodiment 1 and 2.

The contents of this embodiment or part thereof can be implemented in combination with any of the other embodiments and examples.

Embodiment 3

An example of a method for manufacturing the semiconductor device in FIG. 4A will be described.

Note that materials, conditions of heat treatment, and the like are the same as those in another embodiment.

Figure 5A:
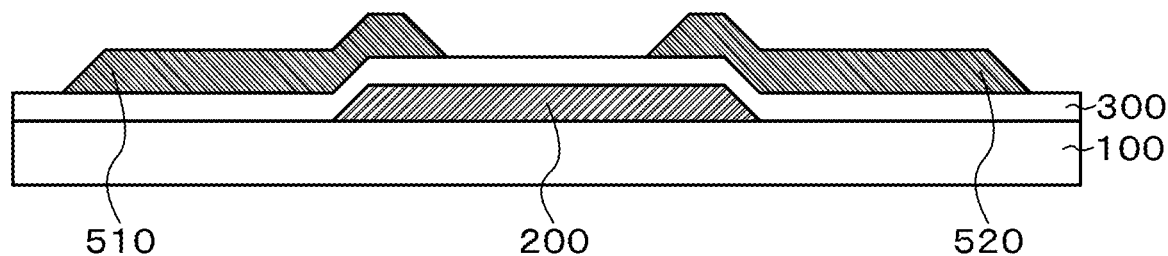
FIGS. 5A to 5C show an example of a method for manufacturing a semiconductor device.

The gate electrode 200 is formed over the substrate 100 having an insulating surface. Then, the gate insulating layer 300 is formed over the gate electrode 200, and the contact electrode 510 and the contact electrode 520 are formed over the gate insulating layer 300 (FIG. 5A).

Figure 5B:
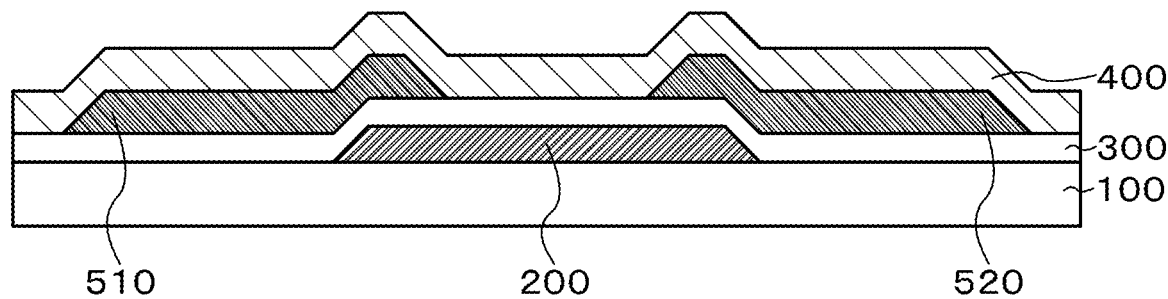

Next, the oxide semiconductor layer 400 is formed over the gate insulating layer 300, the contact electrode 510, and the contact electrode 520 (FIG. 5B).

Next, the oxide semiconductor layer is subjected to first heat treatment.

The conditions of the first heat treatment are the same as those in Embodiment 1.

The first heat treatment may be performed after the oxide semiconductor layer 400 is etched into an island shape to form the oxide semiconductor layer 410.

However, after the oxide semiconductor layer 400 is etched into an island shape to form the oxide semiconductor layer 410, the contact electrodes are exposed.

When the first heat treatment is performed in the state where the contact electrodes are exposed, surfaces of the contact electrodes are oxidized and the conductivity of the surfaces are reduced.

Therefore, the first heat treatment is preferably performed in the state where the contact electrodes are covered with the oxide semiconductor layer 400.

Figure 5C:
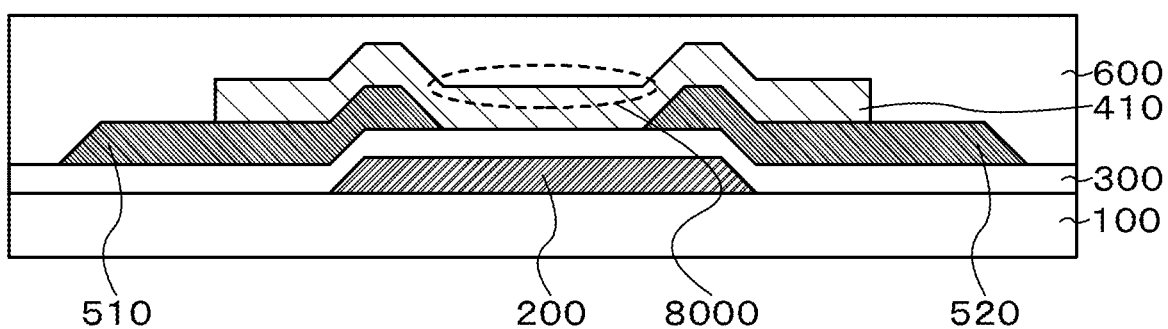

Next, the oxide semiconductor layer 400 is etched into an island shape to form the oxide semiconductor layer 410, and the insulating layer 600 is formed to cover a transistor (FIG. 5C).

Note that a portion surrounded by the dashed line 8000 serves as a back channel.

Figure 6A:
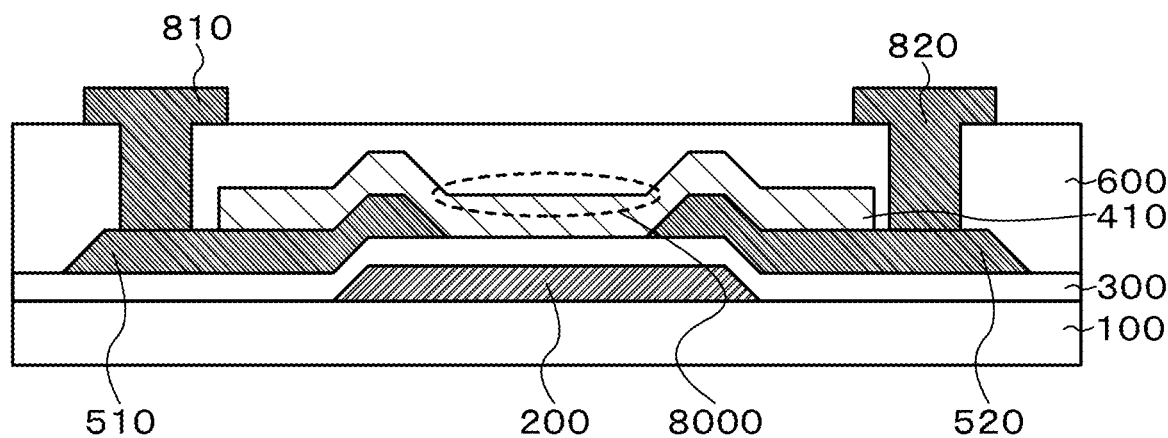
FIGS. 6A and 6B show an example of a method for manufacturing a semiconductor device.

A structure may be employed in which, after the step of FIG. 5C, contact holes are formed in the insulating layer 600 and the wiring 810, the wiring 820, and the like are formed over the insulating layer 600 (FIG. 6A).

Figure 6B:
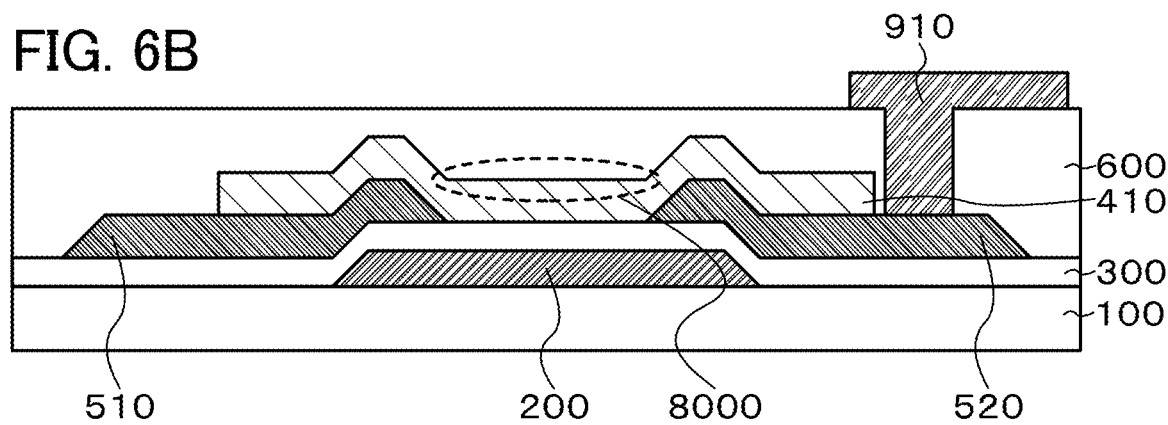

Alternatively, a structure may be employed in which, after the step of FIG. 5C, a contact hole is formed in the insulating layer 600 and a pixel electrode 910 is formed over the insulating layer 600 (FIG. 6B).

After the wirings are formed over the insulating layer 600 as illustrated in FIG. 6A, an insulating layer, a wiring, a transistor, a display element, an antenna, or the like may be further formed over the wirings.

After the pixel electrode 910 is formed as illustrated in FIG. 6B, a display element (e.g., an EL element or a liquid crystal element) is formed, whereby a display device can be formed.

After the step of FIG. 6A or FIG. 6B, second heat treatment is preferably performed.

The second heat treatment may be performed between the step of FIG. 5C and the step of FIG. 6A or FIG. 6B.

The conditions of the second heat treatment are the same as those in Embodiment 1.

The contents of this embodiment or part thereof can be implemented in combination with any of the other embodiments and examples.

Embodiment 4

An example of a method for manufacturing the semiconductor device in FIG. 4C will be described.

Note that materials, conditions of heat treatment, and the like are the same as those in another embodiment.

First, the structure of FIG. 1B is formed as in Embodiment 1.

Note that first heat treatment is also performed as in Embodiment 1.

Figure 7A:
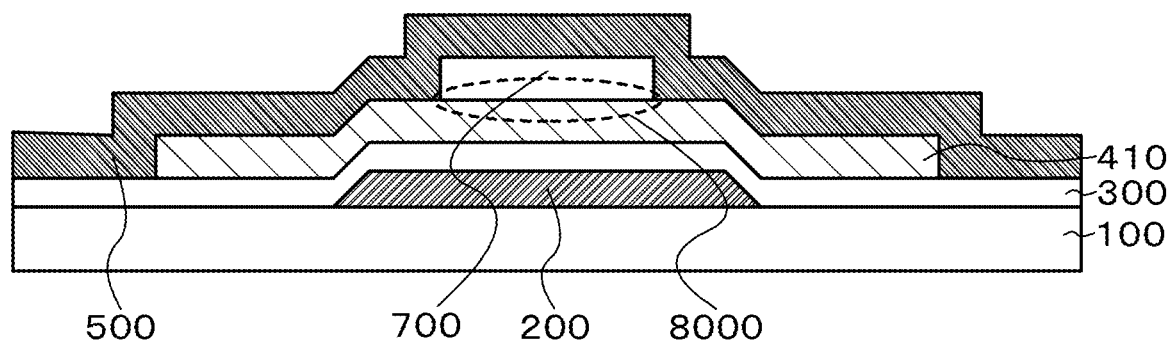
FIGS. 7A to 7C show an example of a method for manufacturing a semiconductor device.

Next, the channel protective layer 700 (island shape) is formed, and the conductive layer 500 is formed to cover the channel protective layer 700 (FIG. 7A).

Figure 7B:
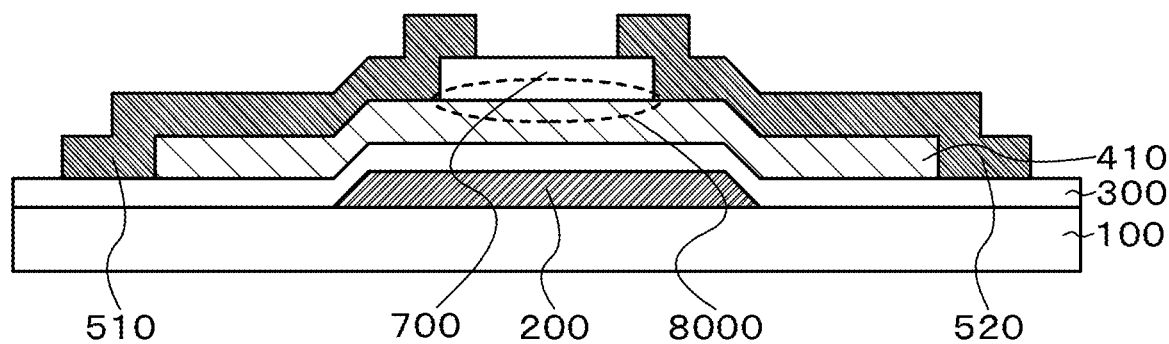

Then, the conductive layer 500 is etched to form the contact electrode 510 and the contact electrode 520 (FIG. 7B).

Note that a portion surrounded by the dashed line 8000 serves as a back channel.

Because of the presence of the channel protective layer 700, the back channel is not etched during the formation of the contact electrodes; therefore, damage to the back channel can be reduced.

Here, the channel protective layer 700 can be formed using a material similar to the material of the insulating layer 600 described in Embodiment 1. The channel protective layer 700 and the insulating layer 600 may be formed using either the same material or different materials.

In the channel-stop transistor, a portion in contact with the back channel is not the insulating layer 600 but the channel protective layer 700.

That is, a film in which the quantity of substances containing a hydrogen element is small is preferably used for the channel protective layer 700.

The channel protective layer 700 is preferably formed using an insulating layer containing excessive oxygen by a method similar to the method described in Embodiment 1.

Figure 7C:
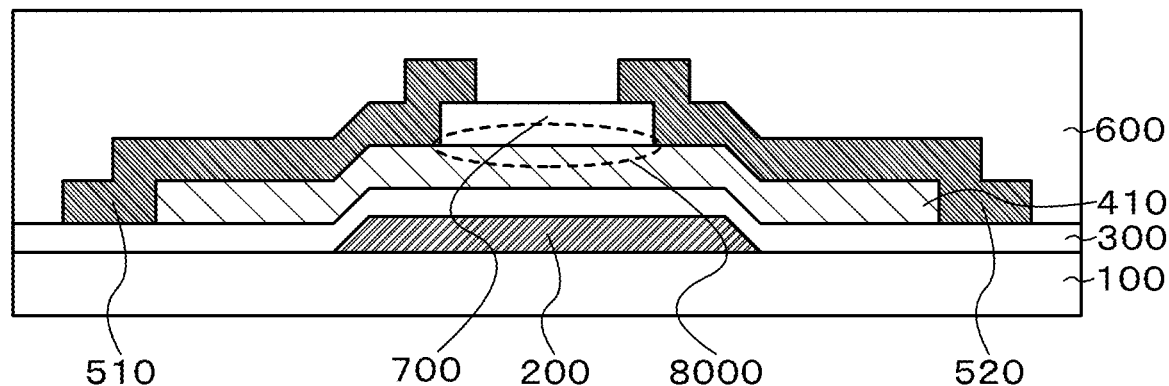

Next, the insulating layer 600 is formed to cover the transistor (FIG. 7C).

Figure 8A:
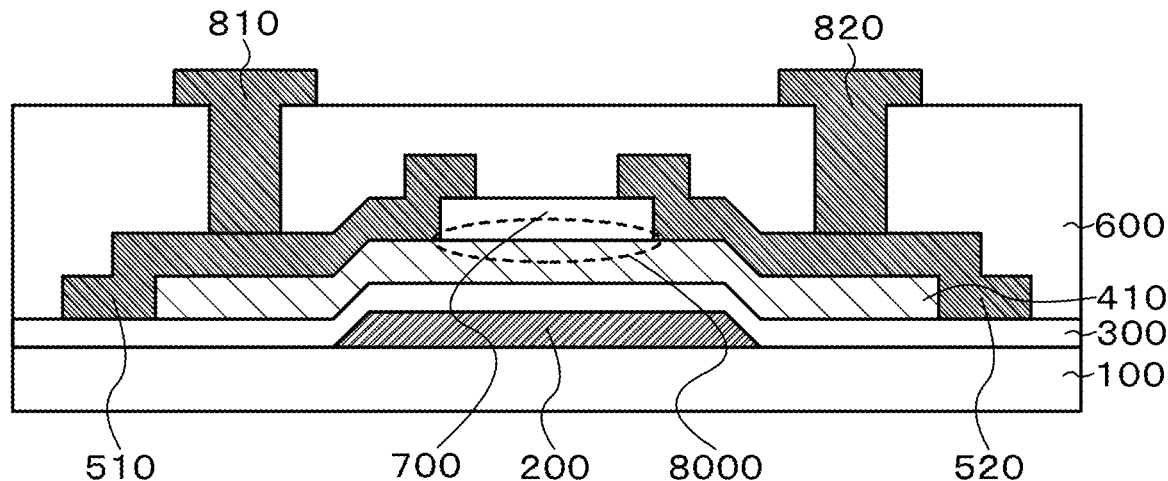
FIGS. 8A and 8B show an example of a method for manufacturing a semiconductor device.

A structure may be employed in which, after the step of FIG. 7C, contact holes are formed in the insulating layer 600 and the wiring 810, the wiring 820, and the like are formed over the insulating layer 600 (FIG. 8A).

Figure 8B:
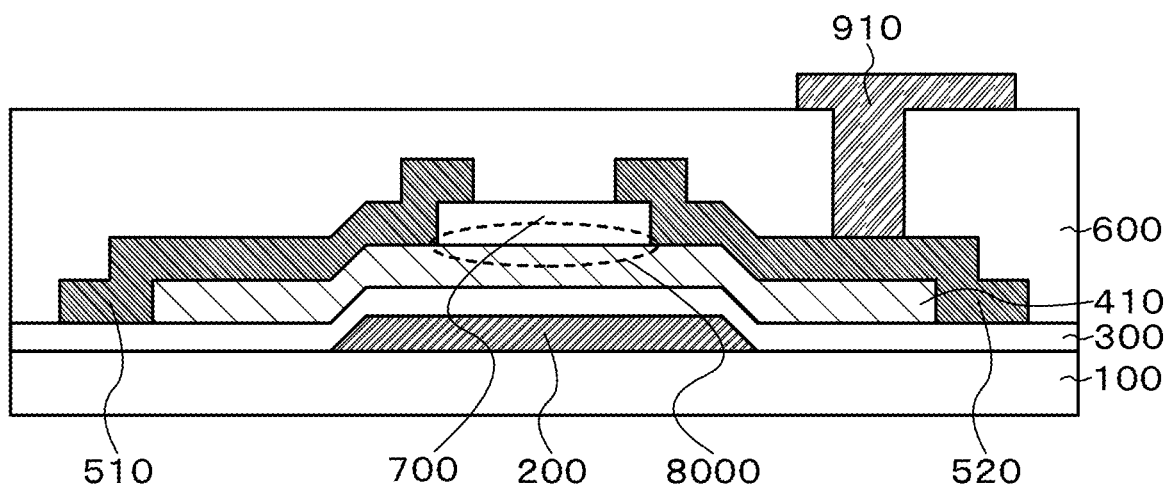

Alternatively, a structure may be employed in which, after the step of FIG. 7C, a contact hole is formed in the insulating layer 600 and the pixel electrode 910 is formed over the insulating layer 600 (FIG. 8B).

After the wirings are formed over the insulating layer 600 as illustrated in FIG. 8A, an insulating layer, a wiring, a transistor, a display element, an antenna, or the like may be further formed over the wirings.

After the pixel electrode 910 is formed as illustrated in FIG. 8B, a display element (e.g., an EL element or a liquid crystal element) is formed, whereby a display device can be formed.

After the step of FIG. 8A or FIG. 8B, second heat treatment is preferably performed.

The second heat treatment may be performed between the step of FIG. 7C and the step of FIG. 8A or FIG. 8B.

The conditions of the second heat treatment are the same as those in Embodiment 1.

The contents of this embodiment or part thereof can be implemented in combination with any of the other embodiments and examples.

Embodiment 5

As a semiconductor device, there are various integrated circuits.

For example, display devices (such as liquid crystal display devices and electroluminescent display devices (light-emitting devices)), semiconductor devices for performing wireless communication through antennas (such as RFID tags, wireless tags, IC chips, wireless chips, noncontact signal processing devices, and semiconductor integrated circuit chips), and the like are given, but the integrated circuit is not limited to these examples.

The contents of this embodiment or part thereof can be implemented in combination with any of the other embodiments and examples.

Example 1

An influence of the nitrogen concentration in an oxide semiconductor was examined.

First, an oxide semiconductor layer was formed over a glass substrate.

Then, the case where heat treatment was not performed after the formation of the oxide semiconductor layer and the case where heat treatment was performed after the formation of the oxide semiconductor layer were compared.

They were compared by secondary ion mass spectrometry (SIMS).

Note that the heat treatment was performed at 350° C. for 1 hour.

The heating atmosphere was set to an air atmosphere or a nitrogen atmosphere.

Here, the oxide semiconductor layer was formed by sputtering using an oxide semiconductor target in which the atom ratio of In to Ga and Zn was 1:1:0.5 ($In_2O_3$:$Ga_2O_3$:ZnO=1:1:1 (at a molar ratio)).

Note that before the formation of the oxide semiconductor layer, the reduction of leakage from a deposition chamber, the reduction of nitrogen on the inner wall of the deposition chamber, deposition onto a dummy substrate, or the like was sufficiently performed, so that incorporation of nitrogen into the oxide semiconductor layer was thoroughly prevented.

(Sample 1)

In Sample 1, the flow rate of a sputtering gas was set as follows: $Ar/N_2=40/0$ sccm (the proportion of $N_2$ was 0%). Note that three Samples 1 were prepared.

The measurement results of SIMS of Sample 1 are shown in FIGS. 10A and 10B.

(Sample 2)

In Sample 2, the flow rate of a sputtering gas was set as follows: $Ar/N_2=35/5$ sccm (the proportion of $N_2$ was 12.5%). Note that three Samples 2 were prepared.

Figure 11A:
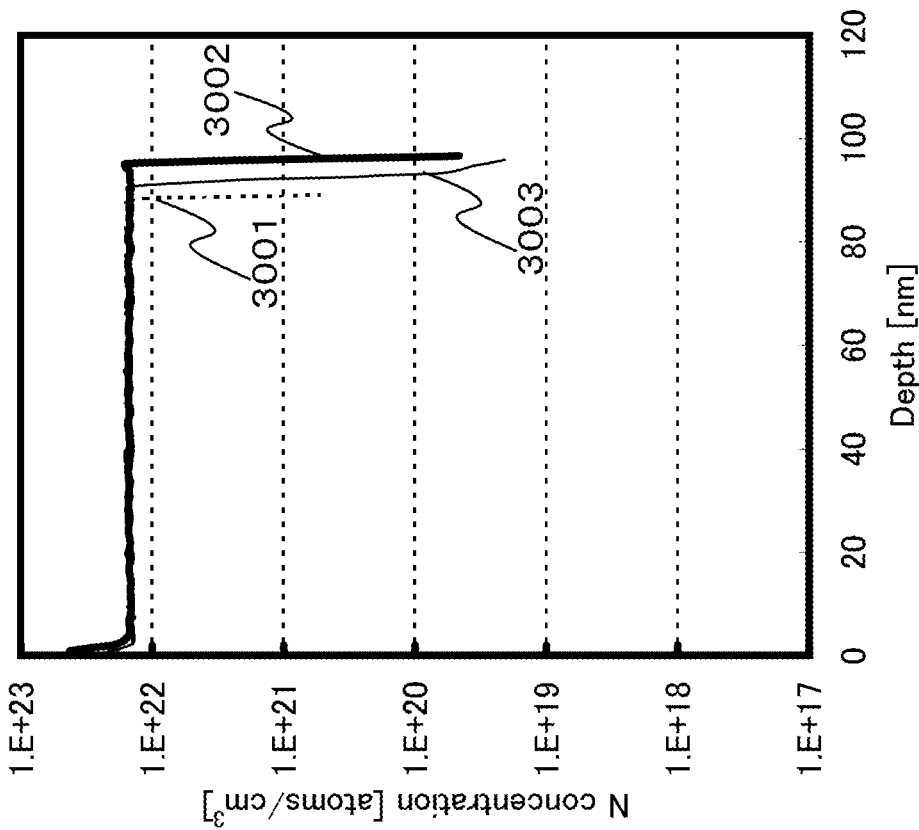
FIGS. 11A and 11B each show SIMS data.
Figure 11B:
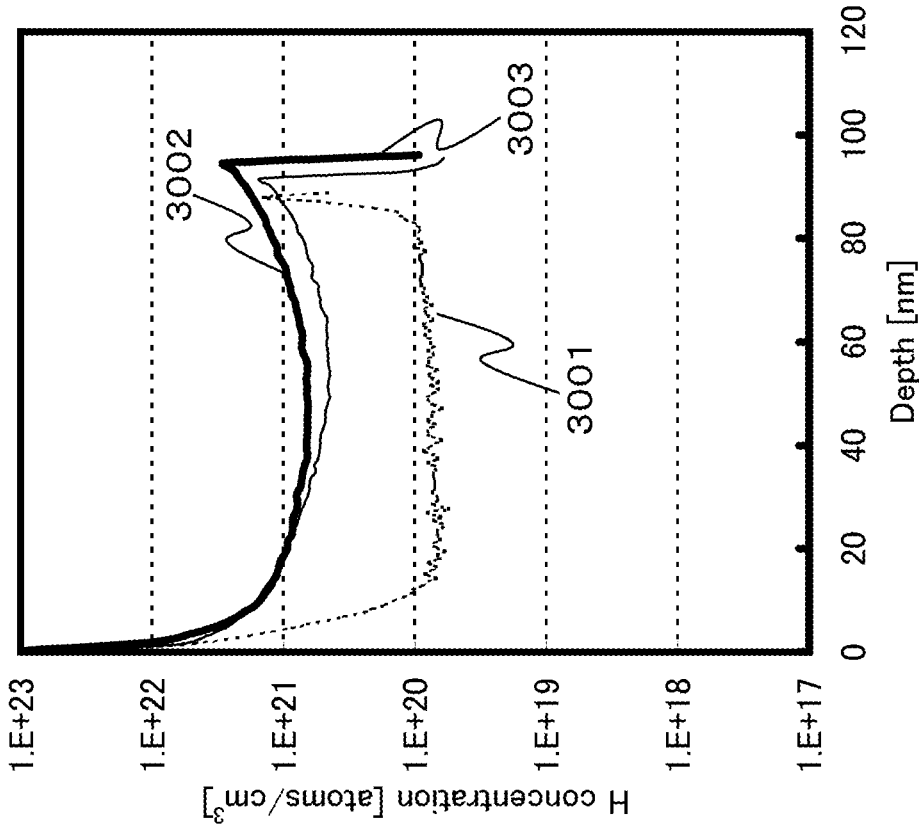

The measurement results of SIMS of Sample 2 are shown in FIGS. 11A and 11B.

(Sample 3)

In Sample 3, the flow rate of a sputtering gas was set as follows: $Ar/N_2=0/40$ sccm (the proportion of $N_2$ was 100%). Note that three Samples 3 were prepared.

Figure 12A:
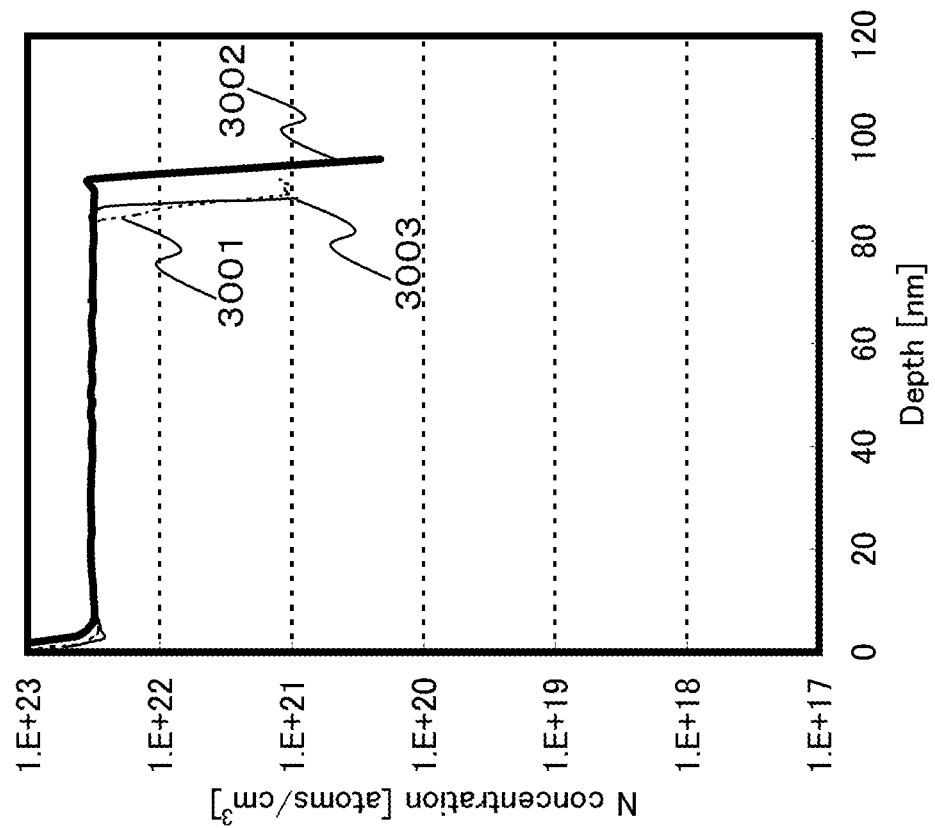
FIGS. 12A and 12B each show SIMS data.
Figure 12B:
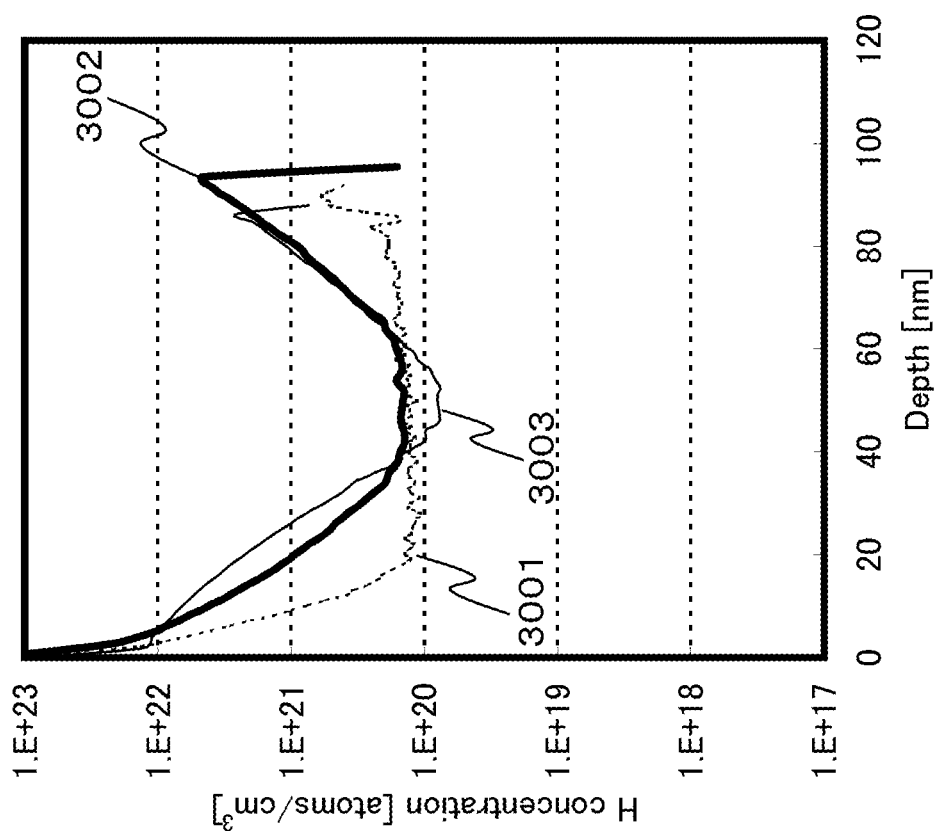

The measurement results of SIMS of Sample 3 are shown in FIGS. 12A and 12B.

(Consideration)

In each of FIGS. 10A and 10B, FIGS. 11A and 11B, and FIGS. 12A and 12B, a dotted line 3001 denotes the sample on which heat treatment was not performed (such a sample is referred to as an "as-deposited sample"), a thick solid line 3002 denotes the sample which was heated in a nitrogen atmosphere (such a sample is referred to as an "$N_2$-baked sample"), and a thin solid line 3003 denotes the sample which was heated in an air atmosphere (such a sample is referred to as an "air-baked sample").

FIG. 10A, FIG. 11A, and FIG. 12A show the hydrogen concentration, and FIG. 10B, FIG. 11B, and FIG. 12B show the nitrogen concentration.

In FIGS. 10A and 10B, FIGS. 11A and 11B, and FIGS. 12A and 12B, the vertical axis represents the concentration, and the horizontal axis represents the depth from a surface of the oxide semiconductor layer (the film thickness).

Note that the measurement results of secondary ion mass spectrometry (SIMS) have an effective range.

In the case of this example, in the vicinity of the surface of the oxide semiconductor layer (at a depth of approximately 0 nm to 30 nm in FIGS. 10A and 10B, FIGS. 11A and 11B, and FIGS. 12A and 12B) and in the vicinity of the interface between the oxide semiconductor layer and the glass substrate (at a depth of approximately 80 nm to 100 nm in FIGS. 10A and 10B, FIGS. 11A and 11B, and FIGS. 12A and 12B), accurate values are difficult to evaluate.

Therefore, in the case of this example, the effective range of the measurement results of SIMS was set to the range of 30 nm to 80 nm in depth.

Here, the average values of the hydrogen concentration in the effective range of the dotted line 3001 (the as-deposited sample) in FIG. 10A, the dotted line 3001 (the as-deposited sample) in FIG. 11A, and the dotted line 3001 (the as-deposited sample) in FIG. 12A are compared. It is found that the average value in FIG. 11A is larger than that in FIG. 10A, and the average value in FIG. 12A is larger than that in FIG. 11A.

Further, the average values of the nitrogen concentrations in the effective range of the dotted line 3001 (the as-deposited sample) in FIG. 10B, the dotted line 3001 (the as-deposited sample) in FIG. 11B, and the dotted line 3001 (the as-deposited sample) in FIG. 12B are compared. It is found that the average value in FIG. 11B is larger than that in FIG. 10B, and the average value in FIG. 12B is larger than that in FIG. 11B.

That is, in the as-deposited samples, the higher the nitrogen concentration in the oxide semiconductor layer is, the higher the hydrogen concentration in the oxide semiconductor layer becomes.

Therefore, the higher the nitrogen concentration in the oxide semiconductor layer is, the more hydrogen is likely to enter the oxide semiconductor layer.

With reference to FIG. 10A, the hydrogen concentration is decreased through the heat treatment.

On the other hand, with reference to FIG. 11A and FIG. 12A, the hydrogen concentration is increased through the heat treatment.

Note that in FIG. 12A, in the range of 30 nm to 60 nm, there is little difference in the hydrogen concentration among the dotted line 3001 (the as-deposited sample), the thick solid line 3002 (the $N_2$-baked sample), and the thin solid line 3003 (the air-baked sample).

However, in the range of 30 nm to 80 nm which is the effective range, the average value of the hydrogen concentration of the thick solid line 3002 (the $N_2$-baked sample) and that of the thin solid line 3003 (the air-baked sample) are larger than that of the dotted line 3001 (the as-deposited sample).

Thus, it is clear that, in the case where the total amounts of hydrogen in the oxide semiconductor layers are compared, the amount of hydrogen shown by the thick solid line 3002 (the $N_2$-baked sample) and that shown by the thin solid line 3003 (the air-baked sample) are larger than that shown by the dotted line 3001 (the as-deposited sample).

It seem that the reason why the thick solid line 3002 (the $N_2$-baked sample) and the thin solid line 3003 (the air-baked sample) have V-like shapes in FIG. 12A is that hydrogen is injected from the surface of the film and the glass substrate.

Here, in Sample 1, the maximum value of the nitrogen concentration in the effective range of the measurement results of SIMS was $1\times10^{20}$ atoms/cm$^3$ or less (less than $1\times10^{20}$ atoms/cm$^3$) (FIG. 10B).

Therefore, in Sample 1, the average value of the nitrogen concentration in the effective range of the measurement results of SIMS was also $1\times10^{20}$ atoms/cm$^3$ or less (less than $1\times10^{20}$ atoms/cm$^3$) (the average value is not larger than the maximum value).

Note that, as for the as-deposited Sample 1 (FIGS. 10A and 10B), the maximum value of the nitrogen concentration in the effective range of the measurement results of SIMS was $9.3\times10^{19}$ atoms/cm$^3$, the minimum value of the nitrogen concentration in the effective range of the measurement results of SIMS was $1.9\times10^{19}$ atoms/cm$^3$, and the average value of the nitrogen concentration in the effective range of the measurement results of SIMS was $6.1\times10^{19}$ atoms/cm$^3$.

Further, as for the as-deposited Sample 1 (FIGS. 10A and 10B), the maximum value of the hydrogen concentration in the effective range of the measurement results of SIMS was $6.9\times10^{19}$ atoms/cm$^3$, the minimum value of the hydrogen concentration in the effective range of the measurement results of SIMS was $4.5\times10^{19}$ atoms/cm$^3$, and the average value of the hydrogen concentration in the effective range of the measurement results of SIMS was $5.6\times10^{19}$ atoms/cm$^3$.

Note that, as for the $N_2$-baked Sample 1 (FIGS. 10A and 10B), the maximum value of the nitrogen concentration in the effective range of the measurement results of SIMS was $9.7\times10^{19}$ atoms/cm$^3$, the minimum value of the nitrogen concentration in the effective range of the measurement results of SIMS was $3.0\times10^{19}$ atoms/cm$^3$, and the average value of the nitrogen concentration in the effective range of the measurement results of SIMS was $6.0\times10^{19}$ atoms/cm$^3$.

Further, as for the $N_2$-baked Sample 1 (FIGS. 10A and 10B), the maximum value of the hydrogen concentration in the effective range of the measurement results of SIMS was $2.3 \times 10^{19}$ atoms/cm$^3$, the minimum value of the hydrogen concentration in the effective range of the measurement results of SIMS was $6.4 \times 10^{18}$ atoms/cm$^3$, and the average value of the hydrogen concentration in the effective range of the measurement results of SIMS was $1.2 \times 10^{19}$ atoms/cm$^3$.

Note that, as for the air-baked Sample 1 (FIGS. 10A and 10B), the maximum value of the nitrogen concentration in the effective range of the measurement results of SIMS was $3.1 \times 10^{19}$ atoms/cm$^3$, the minimum value of the nitrogen concentration in the effective range of the measurement results of SIMS was $4.4 \times 10^{18}$ atoms/cm$^3$, and the average value of the nitrogen concentration in the effective range of the measurement results of SIMS was $1.8 \times 10^{19}$ atoms/cm$^3$.

Further, as for the air-baked Sample 1 (FIGS. 10A and 10B), the maximum value of the hydrogen concentration in the effective range of the measurement results of SIMS was $6.7 \times 10^{18}$ atoms/cm$^3$, the minimum value of the hydrogen concentration in the effective range of the measurement results of SIMS was $2.0 \times 10^{18}$ atoms/cm$^3$, and the average value of the hydrogen concentration in the effective range of the measurement results of SIMS was $3.8 \times 10^{18}$ atoms/cm$^3$.

On the other hand, in Sample 2 and Sample 3, the minimum value of the nitrogen concentration in the effective range of the measurement results of SIMS was $1 \times 10^{22}$ atoms/cm$^3$ or more (FIG. 11B and FIG. 12B).

Therefore, in Sample 2 and Sample 3, the average value of the nitrogen concentration in the effective range of the measurement results of SIMS was also $1 \times 10^{22}$ atoms/cm$^3$ or more (the average value is not smaller than the maximum value).

Note that, as for the as-deposited Sample 2 (FIGS. 11A and 11B), the maximum value of the nitrogen concentration in the effective range of the measurement results of SIMS was $1.6 \times 10^{22}$ atoms/cm$^3$, the minimum value of the nitrogen concentration in the effective range of the measurement results of SIMS was $1.5 \times 10^{22}$ atoms/cm$^3$, and the average value of the nitrogen concentration in the effective range of the measurement results of SIMS was $1.5 \times 10^{22}$ atoms/cm$^3$.

Further, as for the as-deposited Sample 2 (FIGS. 11A and 11B), the maximum value of the hydrogen concentration in the effective range of the measurement results of SIMS was $1.0 \times 10^{20}$ atoms/cm$^3$, the minimum value of the hydrogen concentration in the effective range of the measurement results of SIMS was $6.3 \times 10^{19}$ atoms/cm$^3$, and the average value of the hydrogen concentration in the effective range of the measurement results of SIMS was $7.8 \times 10^{19}$ atoms/cm$^3$.

Note that, as for the $N_2$-baked Sample 2 (FIGS. 11A and 11B), the maximum value of the nitrogen concentration in the effective range of the measurement results of SIMS was $1.5 \times 10^{22}$ atoms/cm$^3$, the minimum value of the nitrogen concentration in the effective range of the measurement results of SIMS was $1.4 \times 10^{22}$ atoms/cm$^3$, and the average value of the nitrogen concentration in the effective range of the measurement results of SIMS was $1.5 \times 10^{22}$ atoms/cm$^3$.

Further, as for the $N_2$-baked Sample 2 (FIGS. 11A and 11B), the maximum value of the hydrogen concentration in the effective range of the measurement results of SIMS was $1.2 \times 10^{21}$ atoms/cm$^3$, the minimum value of the hydrogen concentration in the effective range of the measurement results of SIMS was $6.5 \times 10^{20}$ atoms/cm$^3$, and the average value of the hydrogen concentration in the effective range of the measurement results of SIMS was $7.7 \times 10^{20}$ atoms/cm$^3$.

Note that, as for the air-baked Sample 2 (FIGS. 11A and 11B), the maximum value of the nitrogen concentration in the effective range of the measurement results of SIMS was $1.6 \times 10^{22}$ atoms/cm$^3$, the minimum value of the nitrogen concentration in the effective range of the measurement results of SIMS was $1.5 \times 10^{22}$ atoms/cm$^3$, and the average value of the nitrogen concentration in the effective range of the measurement results of SIMS was $1.6 \times 10^{22}$ atoms/cm$^3$.

Further, as for the air-baked Sample 2 (FIGS. 11A and 11B), the maximum value of the hydrogen concentration in the effective range of the measurement results of SIMS was $6.9 \times 10^{20}$ atoms/cm$^3$, the minimum value of the hydrogen concentration in the effective range of the measurement results of SIMS was $4.4 \times 10^{20}$ atoms/cm$^3$, and the average value of the hydrogen concentration in the effective range of the measurement results of SIMS was $5.3 \times 10^{20}$ atoms/cm$^3$.

Note that, as for the as-deposited Sample 3 (FIGS. 12A and 12B), the maximum value of the nitrogen concentration in the effective range of the measurement results of SIMS was $3.4 \times 10^{22}$ atoms/cm$^3$, the minimum value of the nitrogen concentration in the effective range of the measurement results of SIMS was $3.1 \times 10^{22}$ atoms/cm$^3$, and the average value of the nitrogen concentration in the effective range of the measurement results of SIMS was $3.3 \times 10^{22}$ atoms/cm$^3$.

Further, as for the as-deposited Sample 3 (FIGS. 12A and 12B), the maximum value of the hydrogen concentration in the effective range of the measurement results of SIMS was $1.9 \times 10^{20}$ atoms/cm$^3$, the minimum value of the hydrogen concentration in the effective range of the measurement results of SIMS was $1.1 \times 10^{20}$ atoms/cm$^3$, and the average value of the hydrogen concentration in the effective range of the measurement results of SIMS was $1.4 \times 10^{20}$ atoms/cm$^3$.

Note that, as for the $N_2$-baked Sample 3 (FIGS. 12A and 12B), the maximum value of the nitrogen concentration in the effective range of the measurement results of SIMS was $3.3 \times 10^{22}$ atoms/cm$^3$, the minimum value of the nitrogen concentration in the effective range of the measurement results of SIMS was $3.2 \times 10^{22}$ atoms/cm$^3$, and the average value of the nitrogen concentration in the effective range of the measurement results of SIMS was $3.2 \times 10^{22}$ atoms/cm$^3$.

Further, as for the $N_2$-baked Sample 3 (FIGS. 12A and 12B), the maximum value of the hydrogen concentration in the effective range of the measurement results of SIMS was $8.6 \times 10^{20}$ atoms/cm$^3$, the minimum value of the hydrogen concentration in the effective range of the measurement results of SIMS was $1.4 \times 10^{20}$ atoms/cm$^3$, and the average value of the hydrogen concentration in the effective range of the measurement results of SIMS was $2.7 \times 10^{20}$ atoms/cm$^3$.

Note that, as for the air-baked Sample 3 (FIGS. 12A and 12B), the maximum value of the nitrogen concentration in the effective range of the measurement results of SIMS was $3.5 \times 10^{22}$ atoms/cm$^3$, the minimum value of the nitrogen concentration in the effective range of the measurement results of SIMS was $3.3 \times 10^{22}$ atoms/cm$^3$, and the average value of the nitrogen concentration in the effective range of the measurement results of SIMS was $3.4 \times 10^{22}$ atoms/cm$^3$.

Further, as for the air-baked Sample 3 (FIGS. 12A and 12B), the maximum value of the hydrogen concentration in the effective range of the measurement results of SIMS was $1.0 \times 10^{21}$ atoms/cm$^3$, the minimum value of the hydrogen concentration in the effective range of the measurement results of SIMS was $7.6 \times 10^{19}$ atoms/cm$^3$, and the average value of the hydrogen concentration in the effective range of the measurement results of SIMS was $2.8 \times 10^{20}$ atoms/cm$^3$.

As described above, it is found that hydrogen is easily absorbed by the oxide semiconductor layer containing nitrogen.

In other words, an oxide semiconductor layer whose average value of the nitrogen concentration in the effective range of the measurement results of SIMS is $1\times10^{20}$ atoms/cm$^3$ or less (less than $1\times10^{20}$ atoms/cm$^3$) is a dense layer which is difficult for hydrogen to enter.

In Samples 1 to 3, the nitrogen concentration in the oxide semiconductor layer was not increased even through the heat treatment. In Samples 1, in the case where the air-baking was performed, the nitrogen concentration in the oxide semiconductor layer was decreased.

Here, it is assumed that the reason why nitrogen is absorbed by the oxide semiconductor layer is that part of an oxygen bond in the oxide semiconductor layer is cut off during formation of the oxide semiconductor layer and a nitrogen bond is formed in a position where the oxide bond has been cut off.

Therefore, it is hypothesized that the concentration of nitrogen which is to be contained in the oxide semiconductor layer can be decreased in the case where an oxygen bond is formed in a position where another oxide bond has been cut off. Note that when these assumption and hypothesis are valid, oxide semiconductors other than an In—Ga—Zn—O-based oxide semiconductor are also influenced by nitrogen.

Example 2

In order to demonstrate the validity of the assumption and hypothesis in Example 1, an oxide semiconductor layer was formed using oxygen as a sputtering gas.

When oxygen is supplied, an oxygen bond should be more likely to be formed in a position where another oxygen bond has been cut off.

The oxide semiconductor layer was formed by sputtering using an oxide semiconductor target in which the atom ratio of In to Ga and Zn was 1:1:0.5 (In$_2$O$_3$:Ga$_2$O$_3$:ZnO=1:1:1 (at a molar ratio))

Note that before the formation of the oxide semiconductor layer, the reduction of leakage from a deposition chamber, the reduction of nitrogen on the inner wall of the deposition chamber, deposition onto a dummy substrate, or the like was sufficiently performed, so that incorporation of nitrogen into the oxide semiconductor layer was thoroughly prevented.
(Sample 4)

In Sample 4, the flow rate of a sputtering gas was set as follows: Ar/O$_2$=30/15 sccm (the proportion of O$_2$ was 33.3%).

Figure 13A:
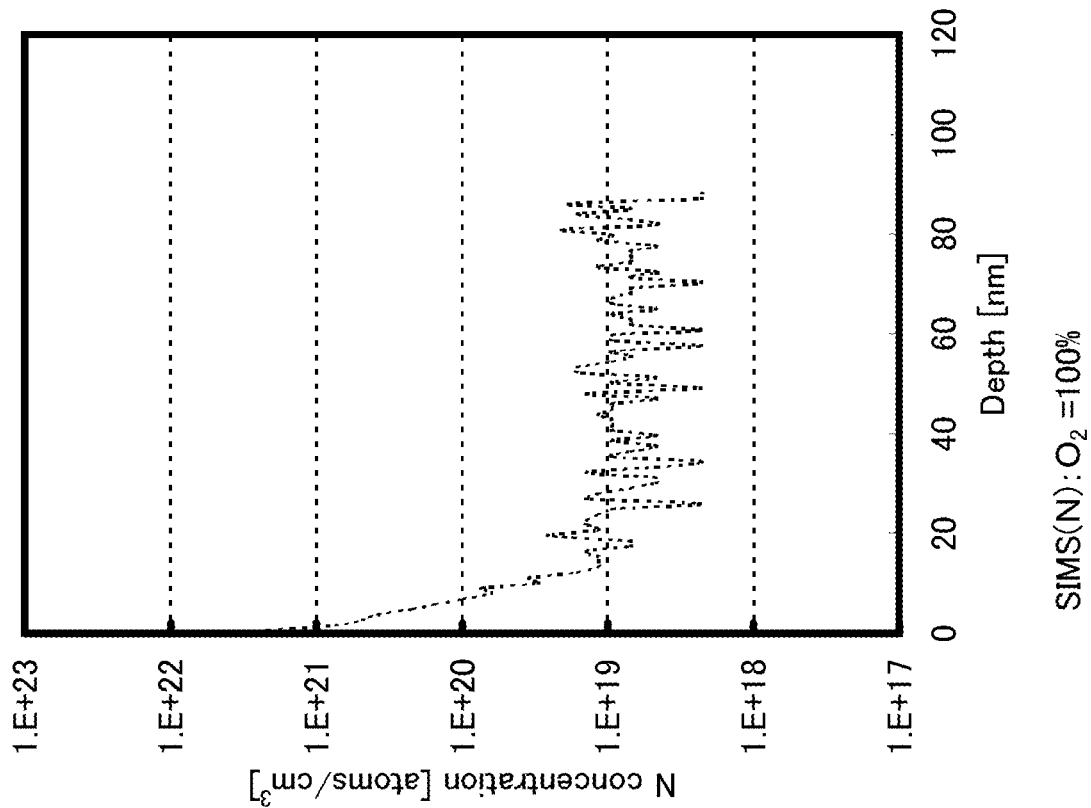
FIGS. 13A and 13B each show SIMS data.

The measurement results of SIMS of Sample 4 are shown in FIG. 13A.
(Sample 5)

In Sample 5 (the as-deposited sample), the flow rate of a sputtering gas was set as follows: Ar/O$_2$=0/40 sccm (the proportion of O$_2$ was 100%).

Figure 13B:
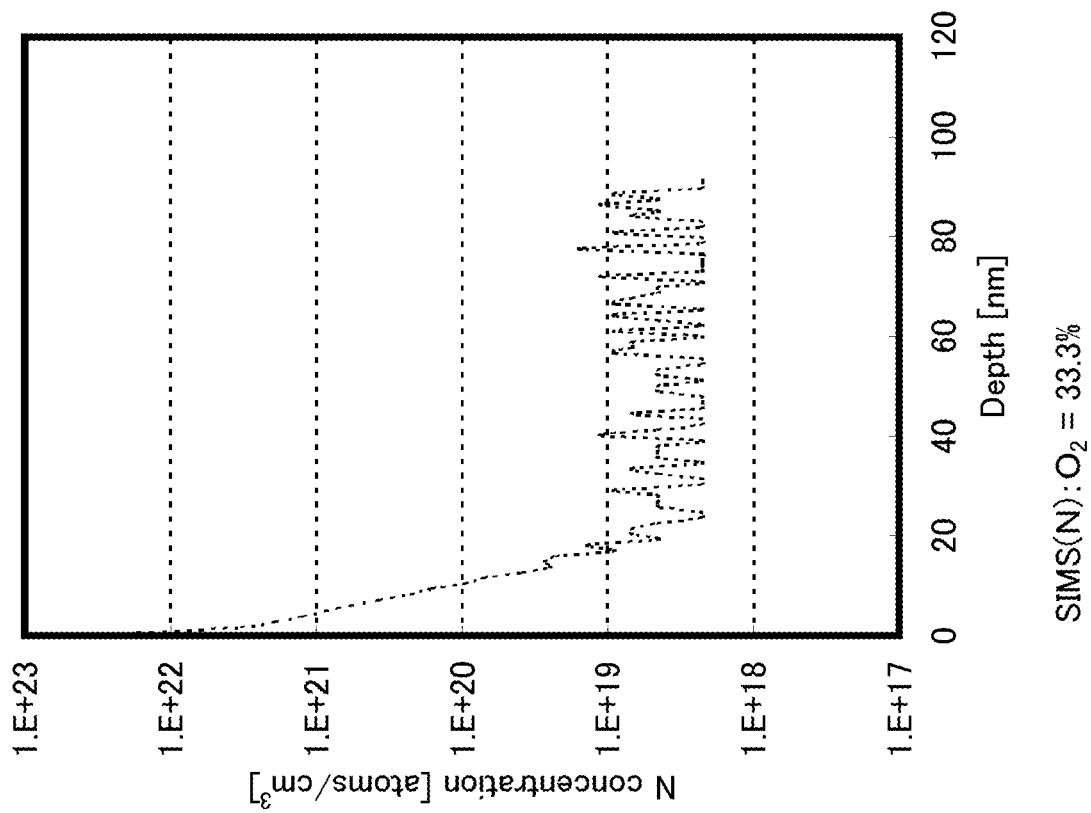

The measurement results of SIMS of Sample 5 are shown in FIG. 13B.
(Consideration)

The effective range of the measurement results of SIMS is the same as that in Example 1.

Here, in Sample 4 (FIG. 13A), the maximum value of the nitrogen concentration in the effective range of the measurement results of SIMS was $5\times10^{19}$ atoms/cm$^3$ or less (less than $5\times10^{19}$ atoms/cm$^3$).

Therefore, in Sample 4 (FIG. 13A), the average value of the nitrogen concentration in the effective range of the measurement results of SIMS was also $5\times10^{19}$ atoms/cm$^3$ or less (less than $5\times10^{19}$ atoms/cm$^3$) (the average value is not larger than the maximum value).

In Sample 4 (FIG. 13A), the average value of the nitrogen concentration in the effective range of the measurement results of SIMS was calculated. The average value was $1\times10^{19}$ atoms/cm$^3$ or less (less than $1\times10^{19}$ atoms/cm$^3$).

In Sample 5 (FIG. 13B), the maximum value of the nitrogen concentration in the effective range of the measurement results of SIMS was $2\times10^{19}$ atoms/cm$^3$ or less (less than $2\times10^{19}$ atoms/cm$^3$).

Therefore, in Sample 5 (FIG. 13B), the average value of the nitrogen concentration in the effective range of the measurement results of SIMS was also $1\times10^{19}$ atoms/cm$^3$ or less (less than $1\times10^{19}$ atoms/cm$^3$).

Sample 4 (FIG. 13A) and Sample 5 (FIG. 13B) have a lower nitrogen concentration than Sample 1 (FIG. 10B) to which oxygen was not added.

Note that, as for the as-deposited Sample 4 (FIG. 13A), the maximum value of the nitrogen concentration in the effective range of the measurement results of SIMS was $1.6\times10^{19}$ atoms/cm$^3$, the minimum value of the nitrogen concentration in the effective range of the measurement results of SIMS was $2.2\times10^{18}$ atoms/cm$^3$, and the average value of the nitrogen concentration in the effective range of the measurement results of SIMS was $4.6\times10^{18}$ atoms/cm$^3$.

Note that, as for the as-deposited Sample 5 (FIG. 13B), the maximum value of the nitrogen concentration in the effective range of the measurement results of SIMS was $1.6\times10^{19}$ atoms/cm$^3$, the minimum value of the nitrogen concentration in the effective range of the measurement results of SIMS was $2.3\times10^{18}$ atoms/cm$^3$, and the average value of the nitrogen concentration in the effective range of the measurement results of SIMS was $7.7\times10^{18}$ atoms/cm$^3$.

Therefore, the validity of the assumption and hypothesis in Example 1 was demonstrated.

Example 3

The difference in electrical characteristics of transistors due to the difference in materials of the insulating layer 600 was examined.
(Common Condition)

The channel-etched transistor in FIG. 2B was manufactured.

For the oxide semiconductor layer 410, a sample formed in the following manner was used: an oxide semiconductor layer was formed by sputtering using an oxide semiconductor target in which the atom ratio of In to Ga and Zn was 1:1:0.5 (In$_2$O$_3$:Ga$_2$O$_3$:ZnO=1:1:1 (at a molar ratio)), and the oxide semiconductor layer was etched into an island shape.

After the step of FIG. 1B, first heat treatment was performed at 350° C. for 1 hour in an air atmosphere.

After the step of FIG. 2B, a contact hole was formed in the insulating layer 600, and a wiring was formed over the insulating layer 600.

After the wiring was formed, second heat treatment was performed at 350° C. for 1 hour in an air atmosphere.
(Sample 6)

The insulating layer 600 was formed by a sputtering method using a silicon oxide target.

The insulating layer 600 was formed under the following conditions. The substrate temperature was set to 100° C. The flow rate of a sputtering gas was set as follows: Ar/O$_2$=40/10 sccm.

The RF power source was used, and the power of the RF power source was set to 1.5 kW.

The deposition pressure was set to 0.4 Pa.
(Sample 7)

The insulating layer 600 was formed by a sputtering method using a silicon oxide target.

The insulating layer 600 was formed under the following conditions. The substrate temperature was set to 250° C. The flow rate of a sputtering gas was set as follows: $Ar/O_2=40/10$ sccm.

The RF power source was used, and the power of the RF power source was set to 1.5 kW.

The deposition pressure was set to 0.4 Pa.

(Sample 8)

The insulating layer 600 was formed by a sputtering method using a silicon oxide target.

The insulating layer 600 was formed under the following conditions. The substrate temperature was set to 100° C. The flow rate of a sputtering gas was set as follows: $Ar/H_2=46/4$ sccm.

The RF power source was used, and the power of the RF power source was set to 1.5 kW.

The deposition pressure was set to 0.4 Pa.

(Sample 9)

The insulating layer 600 was formed by a plasma CVD method.

The insulating layer 600 was formed under the following conditions. The substrate temperature was set to 200° C. The flow rate of deposition gases was set as follows: $SiH_4/N_2O=25/1000$ sccm.

(Sample 10)

The insulating layer 600 was formed by a plasma CVD method.

The insulating layer 600 was formed under the following conditions. The substrate temperature was set to 325° C. The flow rate of deposition gases was set as follows: $SiH_4/N_2O=27/1000$ sccm.

(Sample 11)

The insulating layer 600 was formed using a siloxane film.

(Sample 12)

The insulating layer 600 was formed using an acrylic film.

(Sample 13)

The insulating layer 600 was formed using a polyimide film.

(Consideration)

The threshold voltage Vth of Samples 8 to 13 shifted in a negative direction as compared with that of Samples 6 and 7.

Here, the insulating layer 600 formed with the use of a substance which is intentionally made to contain a hydrogen element contains a hydrogen element.

Consequently, the insulating layer 600 containing hydrogen is in contact with a back channel.

The insulating layer 600 formed by a plasma CVD method contains hydrogen and nitrogen.

Consequently, the insulating layer 600 containing hydrogen is in contact with the back channel.

The siloxane film, the acrylic film, and the polyimide film easily absorb moisture and easily release moisture.

Consequently, the insulating layer 600 which releases moisture is in contact with the back channel.

Here, with the use of computational science (it is also called simulation although there is a difference between computational science and simulation in a strict sense), calculation was performed to examine behavior in the case where a donor was present in the back channel. The calculation showed that, in the case where donor was present in the back channel, the threshold voltage shifted in a negative direction.

Therefore, it was found that, when the insulating layer 600 formed under the condition where hydrogen was not used as a sputtering gas was used, the threshold voltage was prevented from shifting in a negative direction.

In addition, it was found that oxygen was supplied to the back channel through the second heat treatment and oxygen deficiency in the back channel was reduced in the case where the insulating layer 600 containing excessive oxygen which was formed using oxygen as a sputtering gas and using a silicon oxide target was used.

Note that in this example, the second heat treatment was performed at 350° C. for 1 hour.

In the case where the insulating layer 600 was formed using an insulating layer containing excessive oxygen, Sample A on which the second heat treatment has not been performed and Sample B on which the second heat treatment has been performed at 250° C. for 1 hour were prepared. Then, Sample A and Sample B were compared. The results showed that Sample B on which the second heat treatment has been performed at 250° C. for 1 hour had more excellent electrical characteristics of the transistor than Sample A.

Further, a transistor including the insulating layer 600 formed using only oxygen as a sputtering gas and using a silicon target was separately prepared.

The case where the insulating layer 600 was formed using only oxygen as a sputtering gas and using a silicon target at a substrate temperature of 100° C. and the case where the insulating layer 600 was formed using only oxygen as a sputtering gas and using a silicon target at a substrate temperature of 200° C. were compared. The results showed that the case where the substrate temperature was set to 200° C. was better than the case where the substrate temperature was set to 100° C., in the BT test.

The reason why the case where the substrate temperature was set to 200° C. was better in the BT test was found to be that, by increase in the substrate temperature during the formation of the insulating layer 600, moisture on a surface of the back channel was removed.

Therefore, the substrate temperature during the formation of the insulating layer 600 is preferably 200° C. or higher (the upper limit is not limited, but can be set to 300° C. or lower, 400° C. or lower, 500° C. or lower, 600° C. or lower, or 700° C. or lower).

Example 4

The channel-etched transistor in FIG. 2A (the In—Ga—Zn—O-based transistor) was manufactured. Note that the insulating layer 600 was not formed.

Then, a substrate over which the transistor has been formed was immersed in water.

The characteristics obtained before the substrate over which the transistor has been formed was immersed in water and the characteristics obtained just after the substrate over which the transistor has been formed was immersed in water were compared. The results showed that, just after the substrate over which the transistor has been formed was immersed in water, the threshold voltage shifted in a negative direction and off current was increased as compared with those before the substrate over which the transistor has been formed was immersed in water.

Next, the substrate which has been immersed in water was heated at 120° C. for 3 minutes in an air atmosphere to be dried, whereby the characteristics of the transistor were slightly recovered.

Next, the substrate which has been dried for 3 minutes was heated at 120° C. for 10 minutes (13 minutes in total) in an air atmosphere, whereby the characteristics of the transistor were further recovered.

Next, the substrate which has been dried for 13 minutes was heated at 120° C. for 40 minutes (53 minutes in total) in an air atmosphere, whereby the characteristics of the transistor became almost the same ones obtained before the substrate over which the transistor has been formed was immersed in water.

Thus, it is found that when moisture is attached to the surface of the back channel, the characteristics of the transistor are influenced.

A small amount of moisture such as the one which is attached to the surface of the back channel can be removed by heat treatment at 120° C. for 53 minutes or more.

Note that only the evaporation of moisture needs to be achieved, and it is therefore clear that increasing the temperature shortens the drying time.

Example 5

The effect of heat treatment performed on an oxide semiconductor layer was examined using thermal desorption spectroscopy (TDS).

Thermal desorption spectroscopy (TDS) is a method for analyzing a gas emitted when the temperature of a sample is increased.

In this example, emission of water vapor was examined.
(Sample 14)

As Sample 14, a glass substrate was prepared.
(Sample 15)

As Sample 15, a sample formed in the following manner was prepared: an oxide semiconductor layer was formed over a glass substrate by sputtering using an oxide semiconductor target in which the atom ratio of In to Ga and Zn was 1:1:0.5 ($In_2O_3$:$Ga_2O_3$:ZnO=1:1:1 (at a molar ratio)).

Sample 15 has not been subjected to heat treatment (the as-deposited sample).
(Sample 16)

As Sample 16, the same sample as Sample 15 was prepared.
(Sample 17)

As Sample 17, a sample formed in the following manner was prepared: an oxide semiconductor layer was formed over a glass substrate by sputtering using an oxide semiconductor target in which the atom ratio of In to Ga and Zn was 1:1:0.5 ($In_2O_3$:$Ga_2O_3$:ZnO=1:1:1 (at a molar ratio)).

After the oxide semiconductor layer was formed, heat treatment was performed at 250° C. for 1 hour in a nitrogen atmosphere.
(Sample 18)

As Sample 18, a sample formed in the following manner was prepared: an oxide semiconductor layer was formed over a glass substrate by sputtering using an oxide semiconductor target in which the atom ratio of In to Ga and Zn was 1:1:0.5 ($In_2O_3$:$Ga_2O_3$:ZnO=1:1:1 (at a molar ratio)).

After the oxide semiconductor layer was formed, heat treatment was performed at 350° C. for 1 hour in a nitrogen atmosphere.
(Sample 19)

As Sample 19, a sample formed in the following manner was prepared: an oxide semiconductor layer was formed over a glass substrate by sputtering using an oxide semiconductor target in which the atom ratio of In to Ga and Zn was 1:1:0.5 ($In_2O_3$:$Ga_2O_3$:ZnO=1:1:1 (at a molar ratio)).

After the oxide semiconductor layer was formed, heat treatment was performed at 450° C. for 1 hour in a nitrogen atmosphere.

(Consideration)

Figure 14A:
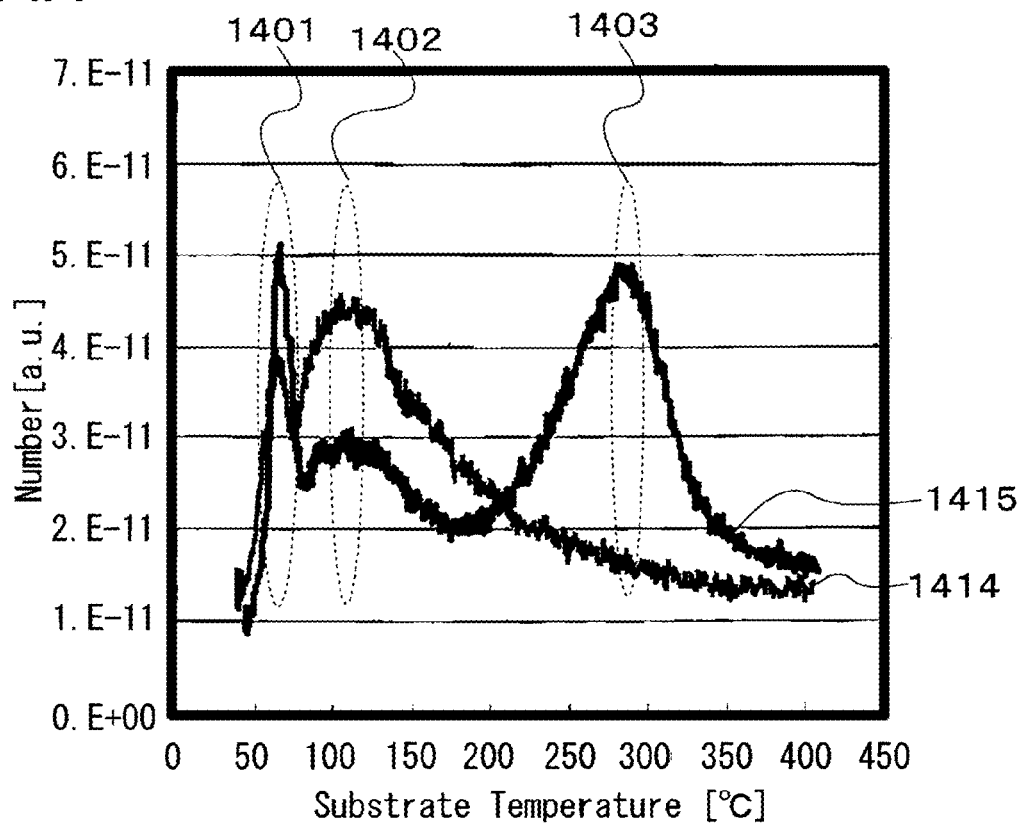
FIGS. 14A and 14B each show TDS data.

The results of the measurement using thermal desorption spectroscopy of Sample 14 and Sample 15 are shown in FIG. 14A.

Note that in FIG. 14A, a graph 1414 corresponds to a graph of Sample 14 (only the glass substrate), and a graph 1415 corresponds to a graph of Sample 15 (the glass substrate and the oxide semiconductor layer (the as-deposited sample)).

In FIG. 14A, there are a peak 1401 of moisture at around 50° C., a peak 1402 of moisture at around 100° C., and a peak 1403 of moisture at around 300° C.

As for Sample 14 including only the glass substrate, there are only the peak 1401 of moisture at around 50° C. and the peak 1402 of moisture at around 100° C., and there is not the peak 1403 of moisture at around 300° C.

On the other hand, as for Sample 15 including the oxide semiconductor layer, there are the peak 1401 of moisture at around 50° C., the peak 1402 of moisture at around 100° C., and the peak 1403 of moisture at around 300° C.

Therefore, the peak 1403 of moisture at around 300° C. is a peak of moisture which is characteristic of the oxide semiconductor layer.

Thus, in the case where the peak 1403 of moisture at around 300° C. is detected, moisture should be contained in the oxide semiconductor layer.

Figure 14B:
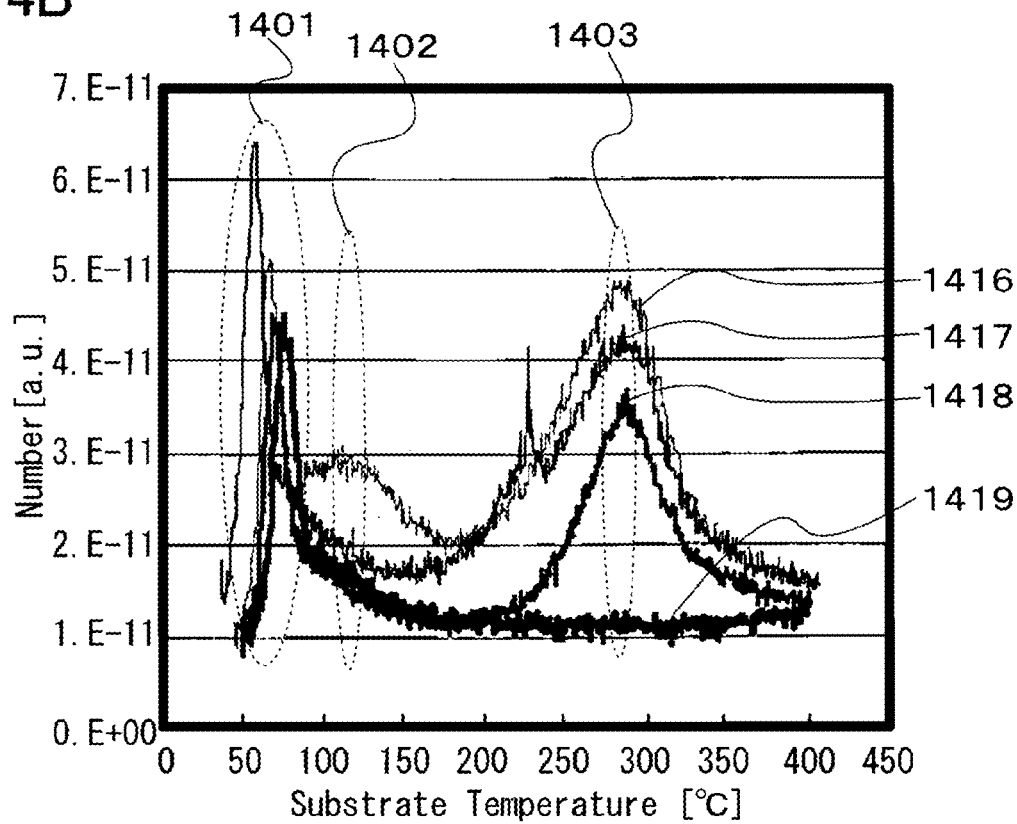

The results of comparing Samples 16 to 19 are shown in FIG. 14B.

Note that in FIG. 14B, a graph 1416 corresponds to a graph of Sample 16 (the as-deposited sample), a graph 1417 corresponds to a graph of Sample 17 (the sample heated at 250° C.), a graph 1418 corresponds to a graph of Sample 18 (the sample heated at 350° C.), and a graph 1419 corresponds to a graph of Sample 19 (the sample heated at 450° C.).

As for Sample 17 (250° C.) and Sample 18 (350° C.), the peak 1403 of moisture at around 300° C. was detected.

The number of the peaks 1403 of moisture at around 300° C. of Sample 17 (250° C.) and Sample 18 (350° C.) is smaller than that of Sample 16 (the as-deposited sample).

Thus, it was found that a certain amount of moisture was reduced through the heat treatment.

As for Sample 19 (450° C.), there is not the peak 1403 of moisture at around 300° C.

Therefore, it can be said that, in the case where heat treatment is performed at 450° C. for 1 hour or more, moisture is thoroughly eliminated.
(Sample 20)

As Sample 20, a sample formed in the following manner was prepared: an oxide semiconductor layer was formed over a glass substrate by sputtering using an oxide semiconductor target in which the atom ratio of In to Ga and Zn was 1:1:0.5 ($In_2O_3$:$Ga_2O_3$:ZnO=1:1:1 (at a molar ratio)).

Then, Sample 20 was subjected to heat treatment at 650° C. for 3 minutes in a nitrogen atmosphere with the use of a gas RTA apparatus.

As for Sample 20 (650° C.), there was not the peak of moisture at around 300° C.

Thus, it can be said that, in the case where heat treatment is performed at 650° C. for 3 minutes or more, moisture is thoroughly eliminated.

Samples formed in the following manner were prepared: an oxide semiconductor layer was formed over a glass substrate by sputtering using an oxide semiconductor target in which the atom ratio of In to Ga and Zn was 1:1:1 ($In_2O_3$:$Ga_2O_3$:ZnO=1:1:2 (at a molar ratio)). Experiments similar to the above (comparison between the as-deposited sample, the sample heated at 250° C., the sample heated at 350° C., and the sample heated at 450° C.) were performed. The results showed that, as for only the sample on which the heat treatment was performed at 450° C. for 1 hour, there was not the peak of moisture at around 300° C.

Samples formed in the following manner were prepared: an oxide semiconductor layer was formed over a glass substrate by sputtering using an oxide semiconductor target in which the atom ratio of In to Ga and Zn was 1:1:4 ($In_2O_3$:$Ga_2O_3$:ZnO=1:1:8 (at a molar ratio)). Experiments similar to the above (comparison between the as-deposited sample, the sample heated as 250° C., the sample heated at 350° C., and the sample heated at 450° C.) were performed. The results showed that, as for only the sample on which the heat treatment was performed at 450° C. for 1 hour, there was not the peak of moisture at around 300° C.

Therefore, it can be said that the oxide semiconductor layer which does not have a peak of moisture at around 300° C. in thermal desorption spectroscopy (the number of peaks is $2 \times 10^{-11}$ or less at higher than or equal to 100° C. and lower than or equal to 400° C. (preferably, higher than or equal to 250° C. and lower than or equal to 300° C.) is an oxide semiconductor layer on which heat treatment has been performed at 450° C. or higher for 1 hour or more, or at 650° C. or higher for 3 minutes or more.

The absence of a peak of moisture at around 300° C. in thermal desorption spectroscopy means the absence of a peak of moisture at higher than or equal to 100° C. and lower than or equal to 400° C. in thermal desorption spectroscopy.

The absence of a peak of moisture at around 300° C. in thermal desorption spectroscopy means the absence of a peak of moisture due to the oxide semiconductor layer.

When the transistors having the structure of FIG. 2A were manufactured with only the conditions of first heat treatment changed, the transistors (250° C. and 350° C.) including an oxide semiconductor layer having a peak of moisture at around 300° C. in thermal desorption spectroscopy had threshold voltage shifted in a negative direction and had significant deterioration in the BT test compared with the transistor (450° C.) including an oxide semiconductor layer which did not have a peak of moisture at around 300° C. in thermal desorption spectroscopy.

Note that as the oxide semiconductor layer, an oxide semiconductor layer formed by sputtering using an oxide semiconductor target in which the atom ratio of In to Ga and Zn was 1:1:0.5 ($In_2O_3$:$Ga_2O_3$:ZnO=1:1:1 (at a molar ratio)) was used.

Note that before the formation of the oxide semiconductor layer, the reduction of leakage from a deposition chamber, the reduction of nitrogen on the inner wall of the deposition chamber, deposition onto a dummy substrate, or the like was sufficiently performed, so that an influence of nitrogen on the oxide semiconductor layer was thoroughly prevented.

Thus, the electrical characteristics of a transistor were found to be influenced by moisture in an oxide semiconductor layer.

Example 6

Degasification (moisture) of the following samples was measured by thermal desorption spectroscopy (TDS).
(Sample 21)

As Sample 21, a sample formed in the following manner was prepared: an oxide semiconductor layer was formed over a glass substrate by sputtering using an oxide semiconductor target in which the atom ratio of In to Ga and Zn was 1:1:0.5 ($In_2O_3$:$Ga_2O_3$:ZnO=1:1:1 (at a molar ratio)), and a silicon oxide film was formed over the oxide semiconductor layer by a sputtering method.

For the formation of the silicon oxide film, silicon oxide was used as a target and the flow rate of gases was set as follows: $Ar/O_2$=40/10 sccm.

Sample 21 has not been subjected to heat treatment.
(Sample 22)

As Sample 22, a sample formed in the following manner was prepared: an oxide semiconductor layer was formed over a glass substrate by sputtering using an oxide semiconductor target in which the atom ratio of In to Ga and Zn was 1:1:0.5 ($In_2O_3$:$Ga_2O_3$:ZnO=1:1:1 (at a molar ratio)), and a silicon oxide film was formed over the oxide semiconductor layer by a sputtering method.

For the formation of the silicon oxide film, silicon oxide was used as a target and the flow rate of gases was set as follows: $Ar/O_2$=40/10 sccm (oxygen was used as a sputtering gas).

After that, heat treatment (in a furnace) was performed at 250° C. for 1 hour in a nitrogen atmosphere.
(Sample 23)

As Sample 23, a sample formed in the following manner was prepared: an oxide semiconductor layer was formed over a glass substrate by sputtering using an oxide semiconductor target in which the atom ratio of In to Ga and Zn was 1:1:0.5 ($In_2O_3$:$Ga_2O_3$:ZnO=1:1:1 (at a molar ratio)), and a silicon oxide film was formed over the oxide semiconductor layer by a sputtering method.

For the formation of the silicon oxide film, silicon oxide was used as a target and the flow rate of gases was set as follows: $Ar/O_2$=40/10 sccm (oxygen was used as a sputtering gas).

After that, heat treatment (in a furnace) was performed at 350° C. for 1 hour in a nitrogen atmosphere.
(Sample 24)

As Sample 24, a sample formed in the following manner was prepared: an oxide semiconductor layer was formed over a glass substrate by sputtering using an oxide semiconductor target in which the atom ratio of In to Ga and Zn was 1:1:0.5 ($In_2O_3$:$Ga_2O_3$:ZnO=1:1:1 (at a molar ratio)), and a silicon oxide film was formed over the oxide semiconductor layer by a sputtering method.

For the formation of the silicon oxide film, silicon oxide was used as a target and the flow rate of gases was set as follows: $Ar/O_2$=40/10 sccm (oxygen was used as a sputtering gas).

After that, heat treatment (in a furnace) was performed at 450° C. for 1 hour in a nitrogen atmosphere.
(Consideration)

When the measurement was performed by thermal desorption spectroscopy (TDS), all the samples did not have a peak of moisture at around 300° C.

From the results of Example 5, moisture is not thoroughly removed by heat treatment at least at 350° C. or lower.

That is, Sample 23 and Sample 24 were supposed to have a peak of moisture at around 300° C.; however, a peak of moisture at around 300° C. was not detected.

The reason of this was found to be that the silicon oxide film formed using oxygen as a sputtering gas (i.e., the silicon oxide film containing excessive oxygen) blocked emission of moisture.

Therefore, it was found that the silicon oxide film formed using oxygen as a sputtering gas (i.e., the silicon oxide film containing excessive oxygen) prevented diffusion of moisture.

In other words, it was found that the silicon oxide film containing excessive oxygen had an effect of blocking moisture.

Conversely, in the case where a silicon oxide film containing excessive oxygen is formed over an oxide semiconductor layer from which moisture has been released by first heat treatment, incorporation of moisture from the outside can be prevented.

Example 7

From the results of Example 5, it was found that moisture was thoroughly removed by heat treatment at 450° C. for 1 hour or more.

Thus, the hydrogen concentration in a sample which has been heated at a temperature higher than 450° C. was examined by secondary ion mass spectrometry (SIMS).

First, a plurality of samples in each of which an oxide semiconductor layer was formed over a glass substrate by sputtering using an oxide semiconductor target in which the atom ratio of In to Ga and Zn was 1:1:0.5 ($In_2O_3$:$Ga_2O_3$:ZnO=1:1:1 (at a molar ratio)) were prepared.

Further, a plurality of samples in each of which an oxide semiconductor layer was formed over a glass substrate by sputtering using an oxide semiconductor target in which the atom ratio of In to Ga and Zn was 1:1:1 ($In_2O_3$:$Ga_2O_3$:ZnO=1:1:2 (at a molar ratio)) were prepared.

Note that before the formation of the oxide semiconductor layer, the reduction of leakage from a deposition chamber, the reduction of nitrogen on the inner wall of the deposition chamber, deposition onto a dummy substrate, or the like was sufficiently performed, so that incorporation of nitrogen into the oxide semiconductor layer was thoroughly prevented.

The flow rate of a sputtering gas was set as follows: $Ar/O_2$=30/15 sccm (the proportion of $O_2$ was 33.3%).

Then, a plurality of samples which have been subjected to heat treatment at 450° C., 550° C., 600° C., and 650° C., respectively, were prepared. Note that the heating time for each sample was 1 hour.

Further, a plurality of samples which have been subjected to heat treatment in a nitrogen atmosphere, an oxygen atmosphere, and an atmosphere containing nitrogen and oxygen (dry air (i.e., an atmosphere in which the ratio of nitrogen to oxygen is 4:1)), respectively, were prepared.

The results of comparison are shown in Table 1.

TABLE 1

|  |  | N2 | O2 | Dry Air |
|---|---|---|---|---|
| 450° C. 1 hour [heat treatment] | | | | |
| Sputtering apparatus A | In:Ga:Zn = 1:1:0.5 (atomic ratio) ($In_2O_3$:$Ga_2O_3$:ZnO = 1:1:1 (molar ratio)) | $2 \times 10^{19}$ atoms/$cm^3$ | $2 \times 10^{19}$ atoms/$cm^3$ | $2 \times 10^{19}$ atoms/$cm^3$ |
|  | In:Ga:Zn = 1:1:1 (atomic ratio) ($In_2O_3$:$Ga_2O_3$:ZnO = 1:1:2 (molar ratio)) | $3 \times 10^{19}$ atoms/$cm^3$ | $2 \times 10^{19}$ atoms/$cm^3$ | $2 \times 10^{19}$ atoms/$cm^3$ |
| Sputtering apparatus B | In:Ga:Zn = 1:1:0.5 (atomic ratio) ($In_2O_3$:$Ga_2O_3$:ZnO = 1:1:1 (molar ratio)) | $3 \times 10^{19}$ atoms/$cm^3$ | $2 \times 10^{19}$ atoms/$cm^3$ | $2 \times 10^{19}$ atoms/$cm^3$ |
|  | In:Ga:Zn = 1:1:1 (atomic ratio) ($In_2O_3$:$Ga_2O_3$:ZnO = 1:1:2 (molar ratio)) | $4 \times 10^{19}$ atoms/$cm^3$ | $2 \times 10^{19}$ atoms/$cm^3$ | $2 \times 10^{19}$ atoms/$cm^3$ |
| 550° C. 1 hour [heat treatment] | | | | |
| Sputtering apparatus A | In:Ga:Zn = 1:1:0.5 (atomic ratio) ($In_2O_3$:$Ga_2O_3$:ZnO = 1:1:1 (molar ratio)) | $3 \times 10^{18}$ atoms/$cm^3$ | $4 \times 10^{18}$ atoms/$cm^3$ | $4 \times 10^{18}$ atoms/$cm^3$ |
|  | In:Ga:Zn = 1:1:1 (atomic ratio) ($In_2O_3$:$Ga_2O_3$:ZnO = 1:1:2 (molar ratio)) | $3 \times 10^{18}$ atoms/$cm^3$ | $4 \times 10^{18}$ atoms/$cm^3$ | $4 \times 10^{18}$ atoms/$cm^3$ |
| Sputtering apparatus B | In:Ga:Zn = 1:1:0.5 (atomic ratio) ($In_2O_3$:$Ga_2O_3$:ZnO = 1:1:1 (molar ratio)) | $3 \times 10^{18}$ atoms/$cm^3$ | $4 \times 10^{18}$ atoms/$cm^3$ | $4 \times 10^{18}$ atoms/$cm^3$ |
|  | In:Ga:Zn = 1:1:1 (atomic ratio) ($In_2O_3$:$Ga_2O_3$:ZnO = 1:1:2 (molar ratio)) | $3 \times 10^{18}$ atoms/$cm^3$ | $4 \times 10^{18}$ atoms/$cm^3$ | $4 \times 10^{18}$ atoms/$cm^3$ |
| 600° C. 1 hour [heat treatment] | | | | |
| Sputtering apparatus A | In:Ga:Zn = 1:1:0.5 (atomic ratio) ($In_2O_3$:$Ga_2O_3$:ZnO = 1:1:1 (molar ratio)) | $6 \times 10^{18}$ atoms/$cm^3$ | $4 \times 10^{18}$ atoms/$cm^3$ | $4 \times 10^{18}$ atoms/$cm^3$ |
|  | In:Ga:Zn = 1:1:1 (atomic ratio) ($In_2O_3$:$Ga_2O_3$:ZnO = 1:1:2 (molar ratio)) | $4 \times 10^{18}$ atoms/$cm^3$ | $3 \times 10^{18}$ atoms/$cm^3$ | $3 \times 10^{18}$ atoms/$cm^3$ |
| Sputtering apparatus B | In:Ga:Zn = 1:1:0.5 (atomic ratio) ($In_2O_3$:$Ga_2O_3$:ZnO = 1:1:1 (molar ratio)) | $4 \times 10^{18}$ atoms/$cm^3$ | $5 \times 10^{18}$ atoms/$cm^3$ | $4 \times 10^{18}$ atoms/$cm^3$ |
|  | In:Ga:Zn = 1:1:1 (atomic ratio) ($In_2O_3$:$Ga_2O_3$:ZnO = 1:1:2 (molar ratio)) | $4 \times 10^{18}$ atoms/$cm^3$ | $4 \times 10^{18}$ atoms/$cm^3$ | $4 \times 10^{18}$ atoms/$cm^3$ |
| 650° C. 1 hour [heat treatment] | | | | |
| Sputtering apparatus A | In:Ga:Zn = 1:1:0.5 (atomic ratio) ($In_2O_3$:$Ga_2O_3$:ZnO = 1:1:1 (molar ratio)) | $4 \times 10^{18}$ atoms/$cm^3$ | $4 \times 10^{18}$ atoms/$cm^3$ | $4 \times 10^{18}$ atoms/$cm^3$ |
|  | In:Ga:Zn = 1:1:1 (atomic ratio) ($In_2O_3$:$Ga_2O_3$:ZnO = 1:1:2 (molar ratio)) | $4 \times 10^{18}$ atoms/$cm^3$ | $4 \times 10^{18}$ atoms/$cm^3$ | $4 \times 10^{18}$ atoms/$cm^3$ |
| Sputtering apparatus B | In:Ga:Zn = 1:1:0.5 (atomic ratio) ($In_2O_3$:$Ga_2O_3$:ZnO = 1:1:1 (molar ratio)) | $4 \times 10^{18}$ atoms/$cm^3$ | $4 \times 10^{18}$ atoms/$cm^3$ | $4 \times 10^{18}$ atoms/$cm^3$ |
|  | In:Ga:Zn = 1:1:1 (atomic ratio) ($In_2O_3$:$Ga_2O_3$:ZnO = 1:1:2 (molar ratio)) | $4 \times 10^{18}$ atoms/$cm^3$ | $4 \times 10^{18}$ atoms/$cm^3$ | $4 \times 10^{18}$ atoms/$cm^3$ |

In Table 1, the values measured by secondary ion mass spectrometry (SIMS) represent the average values in the effective range of SIMS.

From Table 1, it was found that, in the case where heat treatment was performed at 550° C. or higher for 1 hour or more, the hydrogen concentration in the oxide semiconductor layer was significantly decreased.

In other words, the oxide semiconductor layer having a hydrogen concentration of $6 \times 10^{18}$ atoms/$cm^3$ or less is an oxide semiconductor layer which has been subjected to heat treatment at high temperature (at 550° C. or higher for 1 hour or more).

Note that when the transistors having the structure shown in FIG. 2A were manufactured with only the conditions of first heat treatment changed, the transistor (450° C.) including an oxide semiconductor layer having a hydrogen concentration of $1 \times 0^{19}$ atoms/$cm^3$ or more had threshold voltage shifted in a negative direction and had significant deterioration in the BT test compared with the transistors (550° C., 600° C., and 650° C.) each including an oxide semiconductor layer having a hydrogen concentration of less than $1\times10^{19}$ atoms/cm$^3$.

Note that as the oxide semiconductor layer, an oxide semiconductor layer formed by sputtering using an oxide semiconductor target in which the atom ratio of In to Ga and Zn was 1:1:0.5 (In$_2$O$_3$:Ga$_2$O$_3$:ZnO=1:1:1 (at a molar ratio)) was used.

Note that before the formation of the oxide semiconductor layer, the reduction of leakage from a deposition chamber, the reduction of nitrogen on the inner wall of the deposition chamber, deposition onto a dummy substrate, or the like was sufficiently performed, so that an influence of nitrogen on the oxide semiconductor layer was thoroughly prevented.

According to the above, the electrical characteristics of a transistor were found to be influenced by hydrogen in an oxide semiconductor layer.

Example 8

Figure 16:
FIG. 16 shows a TEM photograph.

FIG. 16 is a photograph of a cross section of a thin film transistor including an In—Ga—Zn—O-based oxide semiconductor which is observed with a transmission electron microscope (TEM, H-9000-NAR manufactured by Hitachi, Ltd., 300 kV).

The thin film transistor shown in FIG. 16 is a sample obtained in such a manner that an In—Ga—Zn—O-based oxide semiconductor layer having a thickness of 50 nm was formed as an oxide semiconductor layer 1601, first heat treatment (at 650° C. for 1 hour) was performed in a nitride atmosphere, a titanium layer 1604 having a thickness of 150 nm was formed as a metal film, and further, second heat treatment (at 250° C. for 1 hour) was performed in a nitrogen atmosphere.

In FIG. 16, at the interface between the oxide semiconductor layer 1601 and the titanium layer 1604, an indium-rich layer 1602 and a titanium oxide layer 1603 can be detected.

Note that the indium-rich layer 1602 and the titanium oxide layer 1603 were detected by a fast fourier transform mapping (FFTM) method.

It was found that, through the second heat treatment in the state where the titanium layer 1604 and the oxide semiconductor layer 1601 were in contact with each other, oxygen was extracted from the oxide semiconductor layer and the titanium oxide layer 1603 was formed.

Further, it was found that a portion where oxygen was extracted in the oxide semiconductor layer 1601 became the indium-rich layer 1602 in which a crystal of indium was precipitated.

In this manner, through the second heat treatment in the state where the titanium layer 1604 and the oxide semiconductor layer 1601 are in contact with each other, the titanium oxide layer 1603 can be formed.

Note that it is clear that a similar reaction occurs even when an oxide semiconductor layer other than an In—Ga—Zn—O-based oxide semiconductor layer is used because a reaction of this example is a reaction between oxygen and titanium (Ti).

Therefore, the second heat treatment is preferably performed at 250° C. or higher (the upper limit is not limited, but can be set to 300° C. or lower, 400° C. or lower, 500° C. or lower, 600° C. or lower, or 700° C. or lower).

Note that a material having low resistance (a film containing aluminum as its main component, a film containing copper as its main component, or the like) is preferably formed over the titanium layer 1604 because the wiring resistance can be reduced.

This application is based on Japanese Patent Application serial no. 2009-281505 filed with Japan Patent Office on Dec. 11, 2009, the entire contents of which are hereby incorporated by reference.

The invention claimed is:

1. A semiconductor device comprising:
   a substrate;
   a gate electrode over the substrate;
   a gate insulating layer over the gate electrode;
   an oxide semiconductor layer over the gate insulating layer;
   a pair of contact electrodes over and in contact with the oxide semiconductor layer; and
   an insulating layer over the oxide semiconductor layer and the pair of contact electrodes,
   wherein the pair of contact electrodes are in contact with a side surface of the oxide semiconductor layer,
   wherein the oxide semiconductor layer comprises a channel formation region, and
   wherein a nitrogen concentration in the channel formation region is $1\times10^{20}$ atoms/cm$^3$ or less.

2. The semiconductor device according to claim 1, further comprising a channel protective layer over and in contact with the oxide semiconductor layer,
   wherein the pair of contact electrodes is over the oxide semiconductor layer and the channel protective layer.

3. The semiconductor device according to claim 1, wherein a hydrogen concentration in the oxide semiconductor layer is $6\times10^{18}$ atoms/cm$^3$ or less.

4. The semiconductor device according to claim 1, wherein the oxide semiconductor layer is in an oxygen-excess state.

5. The semiconductor device according to claim 1, wherein the oxide semiconductor layer comprises indium, gallium, and zinc.

6. The semiconductor device according to claim 1, wherein the insulating layer is an oxide insulating layer and in contact with part of the oxide semiconductor layer between the pair of contact electrodes.

7. The semiconductor device according to claim 1, wherein each of the pair of contact electrodes comprises a metal film.

8. A semiconductor device comprising:
   a substrate;
   an oxide semiconductor layer over the substrate;
   a pair of contact electrodes over and in contact with the oxide semiconductor layer;
   a gate insulating layer over the oxide semiconductor layer and the pair of contact electrodes;
   a gate electrode over the gate insulating layer;
   wherein the pair of contact electrodes are in contact with a side surface of the oxide semiconductor layer,
   wherein the oxide semiconductor layer comprises a channel formation region, and
   wherein a nitrogen concentration in the channel formation region is $1\times10^{20}$ atoms/cm$^3$ or less.

9. The semiconductor device according to claim 8, wherein a hydrogen concentration in the oxide semiconductor layer is $6\times10^{18}$ atoms/cm$^3$ or less.

10. The semiconductor device according to claim 8, wherein the oxide semiconductor layer is in an oxygen-excess state.

11. The semiconductor device according to claim 8, wherein the oxide semiconductor layer comprises indium, gallium, and zinc.

12. The semiconductor device according to claim 8, wherein the gate electrode overlaps with the pair of contact electrodes.

13. The semiconductor device according to claim 8, wherein each of the pair of contact electrodes comprises a metal film.

* * * * *